United States Patent
Passlack

(10) Patent No.: US 8,735,903 B2
(45) Date of Patent: *May 27, 2014

(54) DENSITY OF STATES ENGINEERED FIELD EFFECT TRANSISTOR

(75) Inventor: Matthias Passlack, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 292 days.

This patent is subject to a terminal disclaimer.

(21) Appl. No.: 12/974,775

(22) Filed: Dec. 21, 2010

(65) Prior Publication Data

US 2011/0193091 A1  Aug. 11, 2011

Related U.S. Application Data

(60) Provisional application No. 61/303,009, filed on Feb. 10, 2010.

(51) Int. Cl.
H01L 29/15 (2006.01)
(52) U.S. Cl.
USPC ............ 257/76; 257/E29.091; 257/E29.068; 257/E29.242; 257/E27.062
(58) Field of Classification Search
USPC ............ 257/76, E29.091, E29.068, E29.242, 257/E27.062
See application file for complete search history.

(56) References Cited

U.S. PATENT DOCUMENTS

| | | | |
|---|---|---|---|
| 4,163,237 A | | 7/1979 | Dingle et al. |
| 5,349,214 A | | 9/1994 | Tehrani et al. |
| 2008/0296622 A1 | * | 12/2008 | Kiewra et al. ............. 257/194 |

FOREIGN PATENT DOCUMENTS

| KR | 1020040092419 | 4/2004 |
|---|---|---|
| KR | 10542963 | 1/2006 |
| WO | WO99/28975 | 6/1999 |

OTHER PUBLICATIONS

Korean Patent Office, Office Action dated Sep. 17, 2012, Application No. 9-5-2012-054831527. 4 pages.
Hill, R.J.W., et al., "1 µm gate length, $In_{0.75}Ga_{0.25}As$ Channel, thin body n-MOSFET on InP substrate with transductance of 737 µ/s,µm," Electronics Letters, Mar. 27, 2008, vol. 44, No. 7, 2 pages.
Xuan, Y., et al., "High performance submicron inversion-type enhancement-mode InGaAs MOSFETs with ALD $Al_2O_{21}$ $HfO_{21}$, and HfAlO as gate dielectrics," IEEE, 2007, 1-4244-0439-X/07/$25.00, p. 637-640.
Yoh, Kanji, et al., "Molecular Beam Epitaxial Growth fo InAs/GaSb Double Quantum Wells for Complementary Heterojunction Field-Effect Transistors," 2300 Journal of Crystal Growth, 127 Feb. 11, 1993, Nos. 1/4, Amsterdam, NL, 7 pages.

(Continued)

Primary Examiner — Tan N Tran
(74) Attorney, Agent, or Firm — Haynes and Boone, LLP

(57) ABSTRACT

Layer structures for use in density of states ("DOS") engineered FETs are described. One embodiment comprises a layer structure for use in fabricating an n-channel transistor. The layer structure includes a first semiconductor layer having a conduction band minimum $E_{C1}$; a second semiconductor layer having a discrete hole level $H_0$; a wide bandgap semiconductor barrier layer disposed between the first and the second semiconductor layers; a gate dielectric layer disposed above the first semiconductor layer; and a gate metal layer disposed above the gate dielectric layer; wherein the discrete hole level $H_0$ is positioned below the conduction band minimum $E_{c1}$ for zero bias applied to the gate metal layer.

53 Claims, 14 Drawing Sheets

(56) References Cited

OTHER PUBLICATIONS

Yang, M. J., et al., "A Novel Semimetallic Quantum Well FET," 0-7803-2700-4, 1995 IEEE, IEDM 95-375-378.

Li, X., et al., "High-Breakdown-Voltage AlSbAs/InAs n-Channel Field-Effect Transistors," 0741-3106/92. IEEE Electron Device Letters, vol. 31, No. 4, Apr. 1992, 3 pages.

European Patent Office, International Search Report and Written Opinion, Application No. EP11000710, Jan. 10, 2013, 9 pages.

* cited by examiner

DENSITY OF STATES ENGINEERED FIELD EFFECT TRANSISTOR

This patent claims the benefit of U.S. Ser. No. 61/303,009 filed Feb. 10, 2010, the disclosure of which is hereby incorporated by reference in its entirety.

BACKGROUND

The present disclosure relates to field effect transistors ("FETs") with high mobility quantum well channels and engineered density of states ("DOS"), and more specifically, to complementary field effect transistors with abrupt switching of channel carrier density and drain current.

Prior art high mobility metal-oxide-semiconductor field effect transistors ("MOSFETs") form the conducting channel in high mobility bulk materials (see, e.g., Y. Xuan et al., "High Performance submicron inversion-type enhancement-mode InGaAs MOSFETs with ALD $Al_2O_3$, $HfO_2$ and HfAlO as gate dielectrics," IEDM Tech Dig., p. 637 (2007)) or high-mobility quantum wells cladded by a higher band gap semiconductor layer (see, e.g., R. J. W. Hill et al., "1 µm gate length, $In_{0.53}Ga_{0.47}As$ channel thin body n-MOSFET on InP substrate with transconductance of 737 µS/µm," Electron Lett., Vol. 44, p. 498 (2008)). The effective electron mass of bulk materials with high mobility such as $In_{0.53}Ga_{0.47}As$ is small ($m_n$=0.044) resulting in low effective density of states (DOS∝$m_n$) which can limit maximum device current. Typical cladding layers such as $In_{0.5}Al_{0.5}As$ have only somewhat higher mass ($m_n$=0.086) and fail to substantially raise the unified electron effective mass $m_n$ in a quantum well design.

Prior art MOSFETs rely on thermal activation of charge carriers and are limited to a subthreshold swing S of 60 mV/dec at room temperature. For scaled CMOS devices, S easily exceeds 100 mV/dec due to short channel effects. This causes substantial source-drain leakage and excessive power dissipation as well as heat generation and limits the performance of scaled CMOS circuits.

SUMMARY

One embodiment comprises a layer structure for use in fabricating an n-channel transistor. The layer structure includes a first semiconductor layer having a conduction band minimum $E_{C1}$; a second semiconductor layer having a discrete hole level $H_0$; a wide bandgap semiconductor barrier layer disposed between the first and the second semiconductor layers; a gate dielectric layer disposed above the first semiconductor layer; and a gate metal layer disposed above the gate dielectric layer; wherein the discrete hole level $H_0$ is positioned below the conduction band minimum $E_{c1}$ for zero bias applied to the gate metal layer.

Another embodiment comprises a layer structure for use in fabricating a p-channel transistor. The layer structure comprises a first semiconductor layer having a discrete hole level $H_0$; a second semiconductor layer having a conduction band minimum $E_{C2}$; a wide bandgap semiconductor barrier layer disposed between the first and the second semiconductor layers; a gate dielectric layer disposed above the first semiconductor layer; and a gate metal layer disposed above the gate dielectric layer; wherein the discrete hole level $H_0$ is positioned below the conduction band minimum $E_{c2}$ for zero bias applied to the gate metal layer.

Another embodiment comprises a layer structure for use in fabricating an n-channel transistor. The layer structure comprises means for providing a layer having a conduction band minimum $E_{C1}$; means for providing a layer having a discrete hole level $H_0$; and means for providing a wide band gap barrier between the layer having a conduction band minimum and the layer having a discrete hole level. The layer structure further comprises means for providing a high-κ dielectric layer above the layer having a conduction band minimum; and means for providing a gate metal layer disposed above the high-κ dielectric layer. The discrete hole level $H_0$ is positioned below the conduction band minimum $E_{c1}$ for zero bias applied to the gate metal means.

Yet another embodiment comprises a layer structure for use in fabricating a p-channel transistor. The layer structure comprises means for providing a layer having a discrete hole level $H_0$; means for providing a layer having conduction band minimum $E_{C2}$; and means for providing a wide band gap barrier between the layer having a conduction band minimum and the layer having a discrete hole level. The layer structure further comprises means for providing a high-κ dielectric layer above the layer having a discrete hole level; and means for providing a gate metal layer disposed above the high-κ dielectric layer. The discrete hole level $H_0$ is positioned below the conduction band minimum $E_{c2}$ for zero bias applied to the gate metal means.

Yet another embodiment comprises an essentially planar inverter circuit comprising an n-channel transistor employing a first layer structure and a p-channel transistor employing a second layer structure. The first layer structure comprises a first semiconductor layer having a conduction band minimum $E_{C1}$; a second semiconductor layer having a first discrete hole level $H_0$; a first wide bandgap semiconductor barrier layer disposed between the first and the second semiconductor layers; a first gate dielectric layer disposed above the first semiconductor layer; and a first gate metal layer disposed above the first gate dielectric layer; wherein the first discrete hole level $H_0$ is positioned below the conduction band minimum $E_{c1}$ for zero bias applied to the first gate metal layer. The second layer structure comprises a third semiconductor layer having a second discrete hole level $H_0$; a fourth semiconductor layer having a conduction band minimum $E_{C2}$; a second wide bandgap semiconductor barrier layer disposed between the third and the fourth semiconductor layers; a second gate dielectric layer disposed above the third semiconductor layer; and a second gate metal layer disposed above the second gate dielectric layer; wherein the second discrete hole level $H_0$ is positioned below the conduction band minimum $E_{c2}$ for zero bias applied to the second gate metal layer.

Yet another embodiment comprises an essentially planar inverter circuit comprising an n-channel transistor employing a first structure and a p-channel transistor employing a second structure. The first structure comprises means for providing a layer having a conduction band minimum $E_{C1}$; means for providing a first layer having a discrete hole level $H_0$; and means for providing a first wide band gap barrier between the layer having a conduction band minimum $E_{C1}$ and the first layer having a discrete hole level. The first structure further comprises means for providing a first high-κ dielectric layer above the layer having a conduction band minimum $E_{C1}$; and means for providing a first gate metal layer disposed above the first high-κ dielectric layer. The discrete hole level $H_0$ is positioned below the conduction band minimum $E_{c1}$ for zero bias applied to the first gate metal layer. The second structure comprises means for providing a second layer having a discrete hole level $H_0$; means for providing a layer having conduction band minimum $E_{C2}$; and means for providing a second wide band gap barrier between the layer having a conduction band minimum $E_{C2}$ and the second layer having a discrete hole level. The second structure further comprises means for providing a second high-κ dielectric layer above the second layer having a discrete hole level; and means for providing a second gate metal layer disposed above the second high-κ dielectric layer. The discrete hole level $H_0$ is positioned below the conduction band minimum $E_{c2}$ for zero bias applied to the second gate metal layer.

Still another embodiment comprises a device including an n-channel transistor fabricated using a layer structure comprising a first semiconductor layer having a conduction band minimum $E_{C1}$; a second semiconductor layer having a discrete hole level $H_0$; and a wide band gap semiconductor barrier layer disposed between the first and the second semiconductor layers. The layer structure further comprises a gate dielectric layer disposed above the first semiconductor layer; and a gate metal layer disposed above the gate dielectric layer. The discrete hole level $H_0$ is positioned below the conduction band minimum $E_{c1}$ for zero bias applied to the gate metal layer.

Still another embodiment comprises a device including a p-channel transistor fabricated using a layer structure comprising a first semiconductor layer having a discrete hole level $H_0$; a second semiconductor layer having a conduction band minimum $E_{C2}$; and a wide band gap semiconductor barrier layer disposed between the first and the second semiconductor layers. The layer structure further comprises a gate dielectric layer disposed above the first semiconductor layer; and a gate metal layer disposed above the gate dielectric layer. The discrete hole level $H_0$ is positioned below the conduction band minimum $E_{c2}$ for zero bias applied to the gate metal layer.

Still another embodiment comprises a device including an essentially planar inverter circuit comprising an n-channel transistor employing a first layer structure and a p-channel transistor employing a second layer structure. The first layer structure comprises a first semiconductor layer having a conduction band minimum $E_{C1}$; a second semiconductor layer having a first discrete hole level $H_0$; a first wide band gap semiconductor barrier layer disposed between the first and the second semiconductor layers; a first gate dielectric layer disposed above the first semiconductor layer; and a first gate metal layer disposed above the first gate dielectric layer. The first discrete hole level $H_0$ is positioned below the conduction band minimum $E_{c1}$ for zero bias applied to the first gate metal layer. The second layer structure comprises a third semiconductor layer having a second discrete hole level $H_0$; a fourth semiconductor layer having a conduction band minimum $E_{C2}$; a second wide band gap semiconductor barrier layer disposed between the third and the fourth semiconductor layers; a second gate dielectric layer disposed above the third semiconductor layer; and a second gate metal layer disposed above the second gate dielectric layer. The second discrete hole level $H_0$ is positioned below the conduction band minimum $E_{c2}$ for zero bias applied to the second gate metal layer.

DETAILED DESCRIPTION

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, the following description shows two or more layers in contact with each other. Such contact can be direct physical contact, or there may be an intervening layer and the contact is indirect, such as through indirect coupling.

The embodiments described herein provide a high-mobility MOSFET with substantially increased unified effective mass to increase maximum current levels. The embodiments described herein further describe a MOSFET with abrupt switching of channel carriers to dramatically reduce off-state current levels in CMOS devices. FIGS. 1A-5 illustrate a layer structure with increased effective electron mass. FIGS. 6A-13 illustrate two different layer structures for complementary devices exhibiting abrupt switching.

Figure 1A:
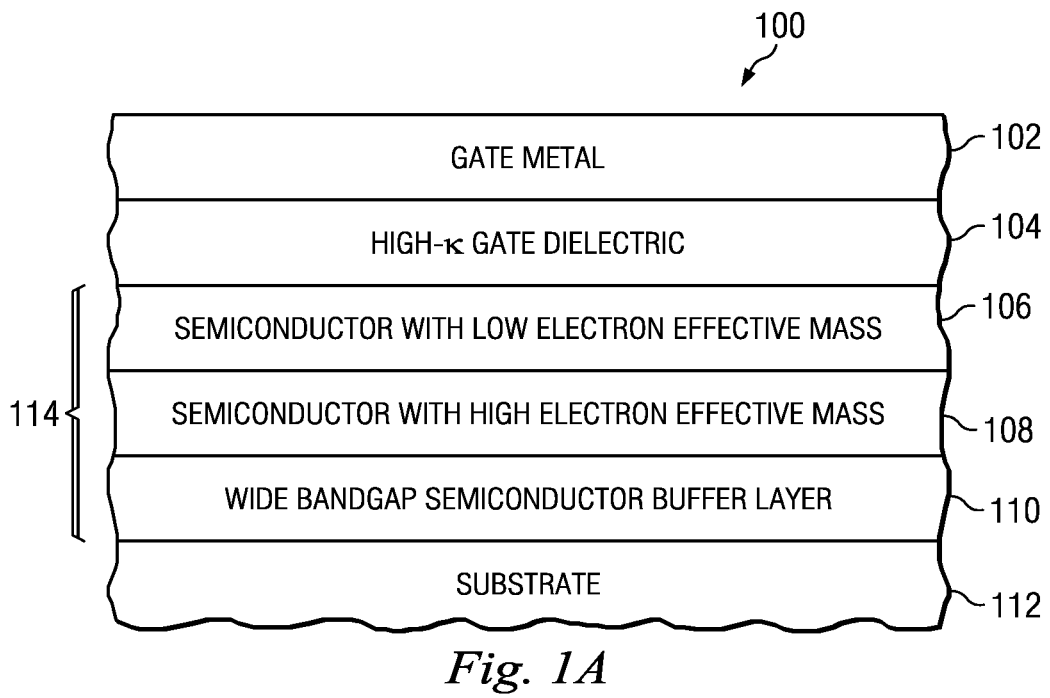
FIG. 1A illustrates a layer structure used in a DOS engineered MOSFET in accordance with one embodiment.

A layer structure used in a DOS engineered MOSFET in accordance with one embodiment is illustrated in FIG. 1A and designated by a reference numeral 100. The structure 100 includes a gate metal 102, a high-κ gate dielectric 104, a high mobility channel semiconductor layer with low electron effective mass $m_{n1}$ 106, a wide bandgap cladding semiconductor layer with high electron effective mass $m_{n2}$ 108, a wide bandgap semiconductor buffer layer 110, and a substrate 112. The cladding layer is selected such that its electron effective mass $m_{n2} \gg m_{n1}$. Layers 106-110 are collectively designated by a reference numeral 114.

Figure 1B:
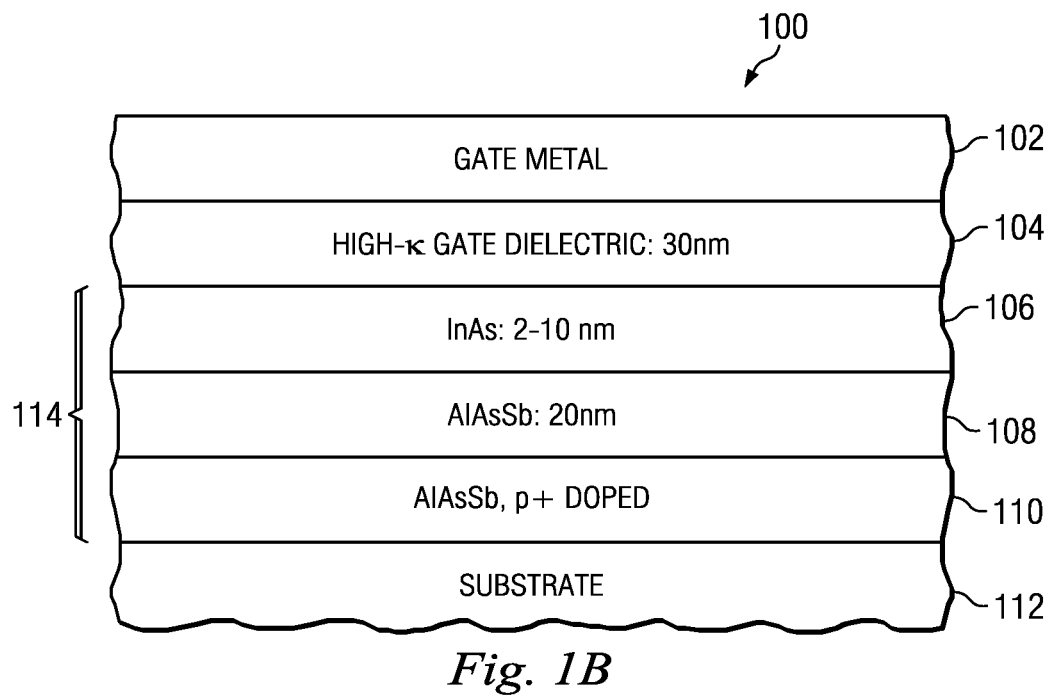
FIG. 1B is a more detailed illustration of one embodiment of the layer structure of FIG. 1A.

FIG. 1B is a more detailed illustration of an embodiment of the layer structure 100. As shown in FIG. 1B, the high mobility channel semiconductor layer with low electron effective mass 106 comprises InAs ($m_{n1}$=0.023) with a thickness of approximately 2-10 nm, the wide bandgap cladding semiconductor layer with high electron effective mass 108 comprises aluminum arsenide antimonide (AlAsSb) ($m_{n2}$=0.33) with a thickness of approximately 20 nm, and the wide bandgap semiconductor buffer layer 110 comprises $p^+$ doped AlAsSb. As shown in FIG. 1B, the thickness of the gate dielectric layer is approximately 30 nm.

Figure 1C:
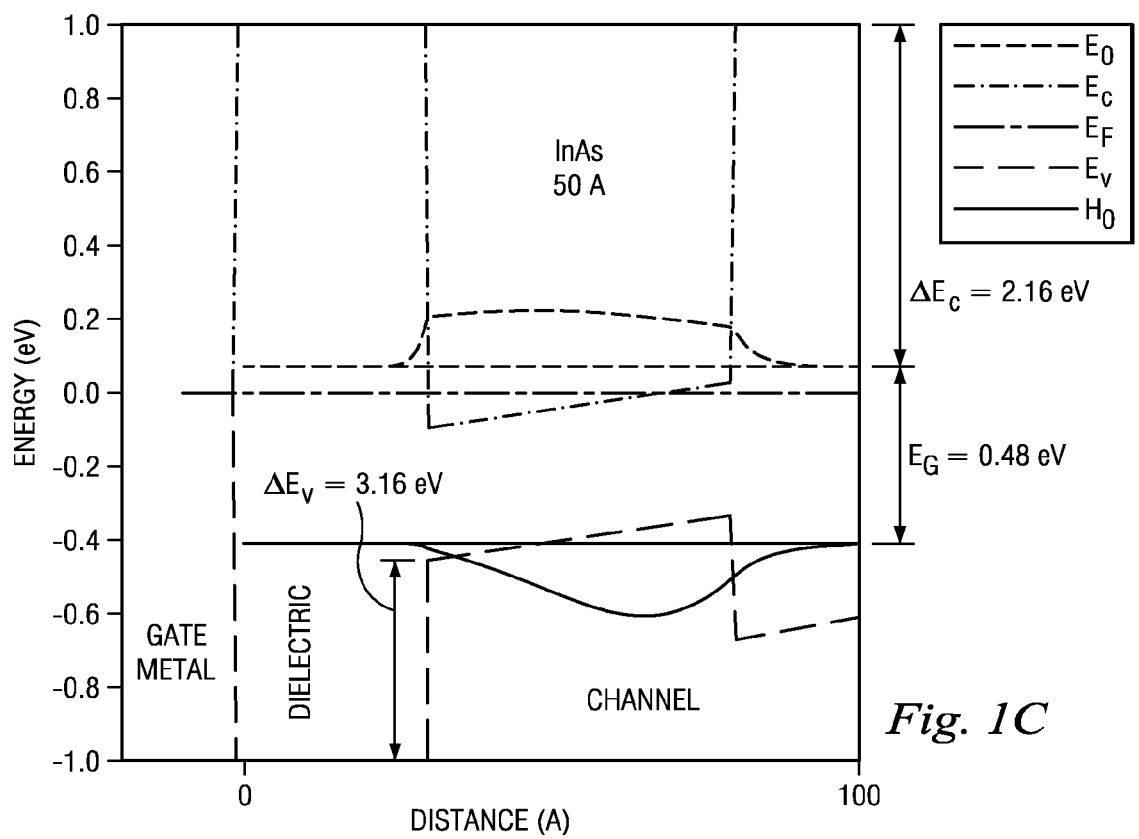
FIG. 1C is an energy band diagram of the layer structure of FIG. 1B.

FIG. 1C illustrates an energy band diagram of the layer structure 100 as shown in FIG. 1B with a 5 nm InAs layer 106 and the discrete electron energy level $E_0$ and hole energy level $H_0$. The bandgap $E_G$ of the InAs quantum well layer is 0.48 eV and is increased due to quantum size effects by 0.12 eV from the InAs bulk value of 0.36 eV.

Figure 2A:
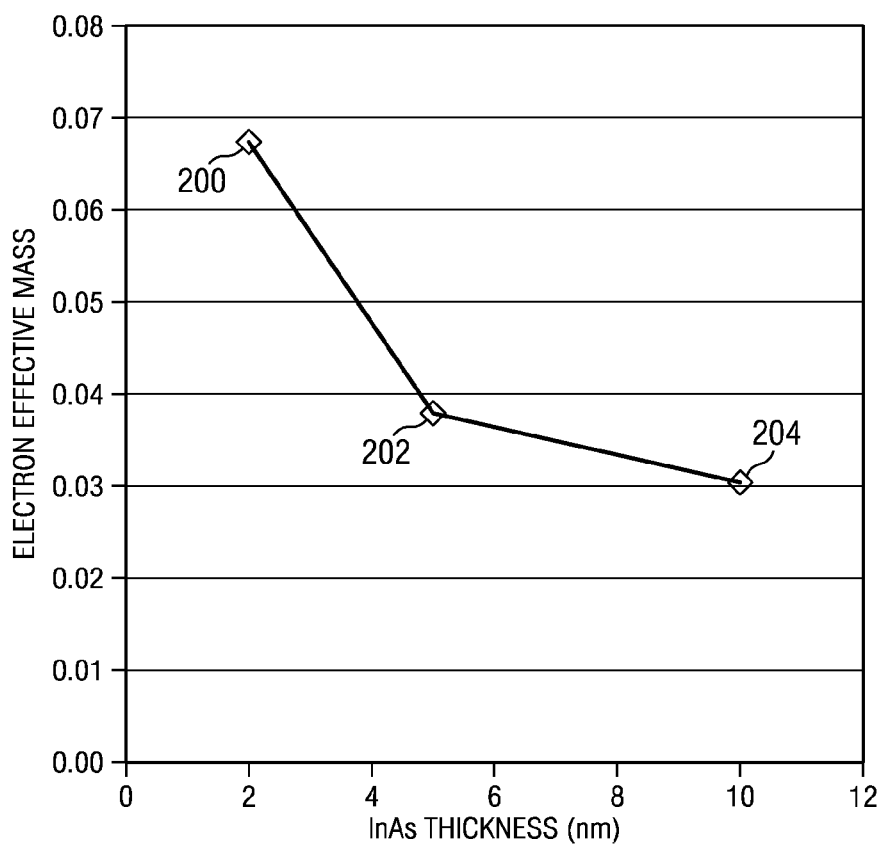
FIG. 2A illustrates the unified effective mass of the layer structure of FIG. 1B for indium arsenide (InAs) layer thicknesses of 2, 5, and 10 nm.

FIG. 2A illustrates a graph of unified effective mass $m_n$ of the layer structure 100 of FIG. 1B for InAs layer thicknesses of 2, 5, and 10 nm, respectively represented by points 200, 202, and 204. The unified effective mass reaches 0.067 for a 2 nm InAs quantum well, exceeding the effective mass of bulk InAs ($m_{n1}$=0.023) by a factor of 2.9 resulting in an identical DOS increase of 2.9 over bulk InAs.

Figure 2B:
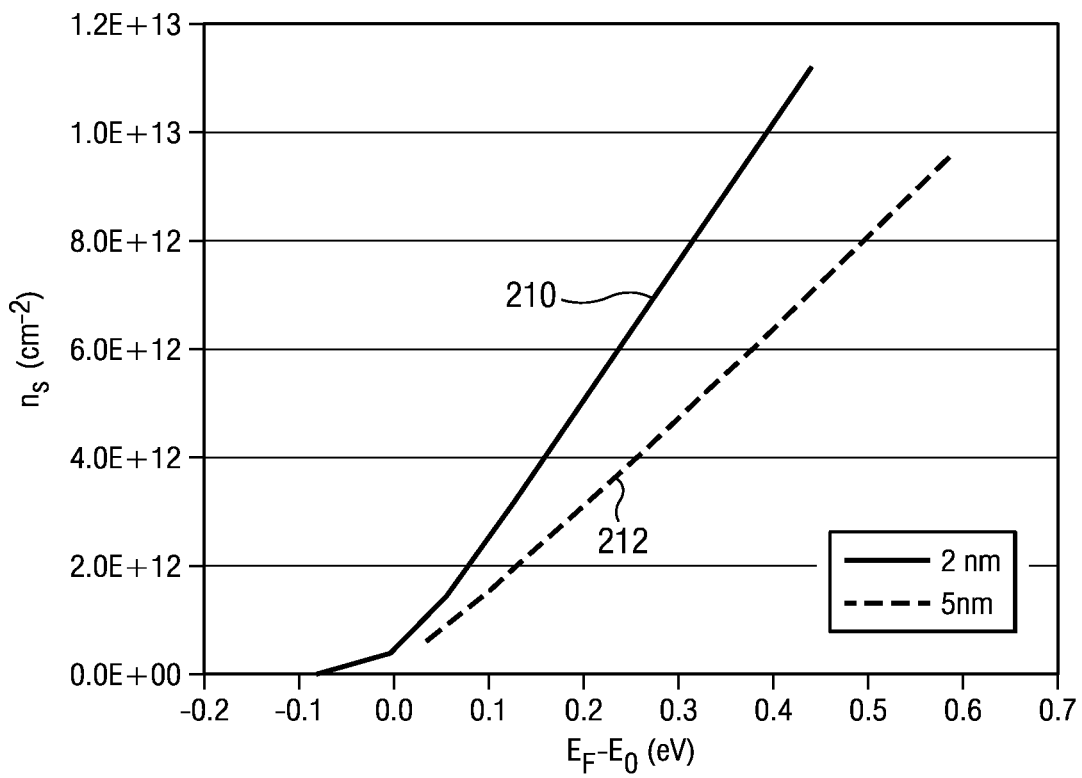
FIG. 2B illustrates the electron sheet carrier concentration of the layer structure of FIG. 1B for InAs layer thicknesses of 2 nm and 5 nm.

FIG. 2B illustrates a graph of electron sheet carrier concentration of the layer structure 100 as shown in FIG. 1B for 2 nm ($m_n$=0.067), and 5 nm ($m_n$=0.038) InAs layer thicknesses, as respectively represented by lines 210, 212. The increased $m_n$ with thinner InAs quantum well leads to higher DOS and in turn, to higher electron sheet carrier concentration for identical Fermi level $E_F$-$E_0$ separation.

Figure 3A:
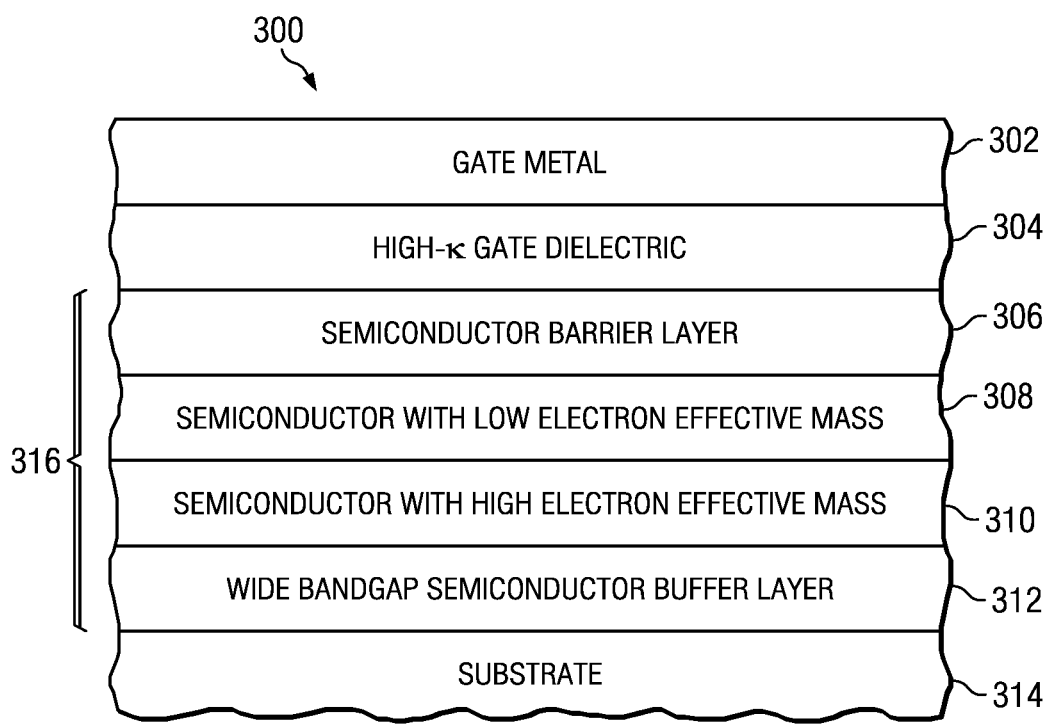
FIG. 3A illustrates a layer structure used in a DOS engineered MOSFET in accordance with another embodiment.

A layer structure used in a DOS engineered MOSFET in accordance with another embodiment is illustrated in FIG. 3A and designated by a reference numeral 300. As shown in FIG. 3A, the layer structure 300 includes a gate metal layer 302, a high-κ gate dielectric layer 304, a semiconductor barrier layer 306, a high mobility channel semiconductor layer with low electron effective mass $m_{n1}$ 308, a wide bandgap cladding semiconductor layer with high electron effective mass $m_{n2}$ 310, a wide bandgap semiconductor buffer layer 312, and a substrate 314. The cladding layer 310 is selected such that its electron effective mass $m_{n2} \gg m_{n1}$. The semiconductor barrier layer 306 separates the conducting channel electrons situated in the high mobility channel semiconductor layer 308 from the oxide-semiconductor interface. The barrier layer 306 can improve electron transport or be essential for achieving a low defectivity oxide-semiconductor interface with both factors are important to achieve optimum MOSFET operation. Layers 306-312 are collectively designated by a reference numeral 316.

Figure 3B:
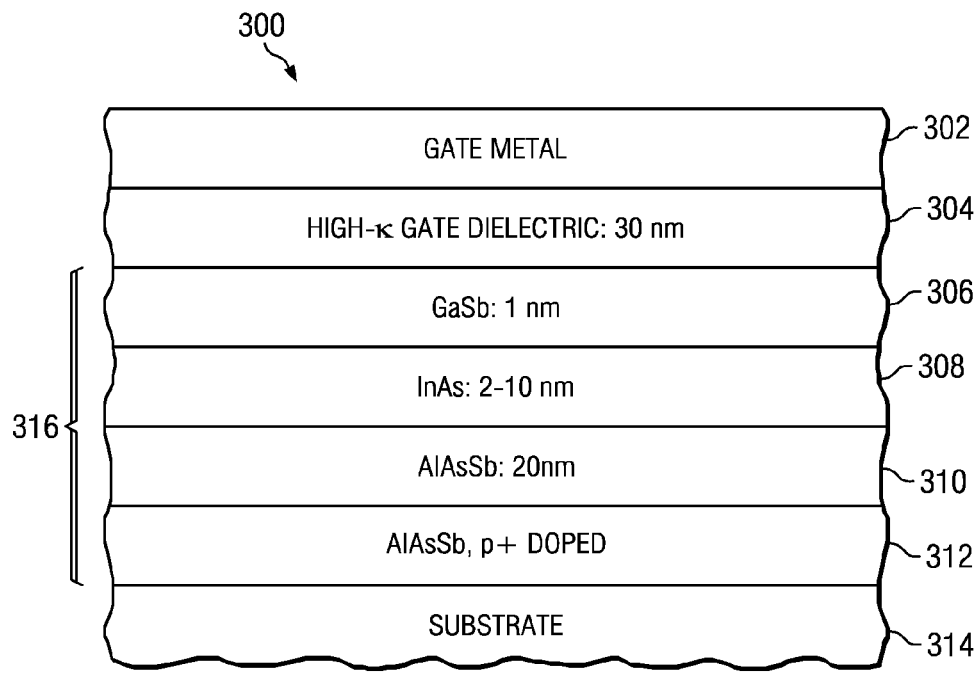
FIG. 3B is a more detailed illustration of one embodiment of the layer structure of FIG. 3A.

FIG. 3B is a more detailed illustration of an embodiment of the layer structure 300 of FIG. 3A for implementing a DOS engineered n-channel transistor. As shown in FIG. 3B, the semiconductor barrier layer 306 comprises gallium antimonide (GaSb) having a thickness of approximately 1 nm, the high mobility channel semiconductor layer with low electron effective mass 308 comprises InAs ($m_{n1}$=0.023) with a thickness of approximately 2-10 nm, the wide bandgap cladding semiconductor layer with high electron effective mass 310 comprises AlAsSb ($m_{n2}$=0.33) with a thickness of approximately 20 nm, and the wide bandgap semiconductor buffer layer 312 comprises $p^+$ doped AlAsSb.

Figure 3C:
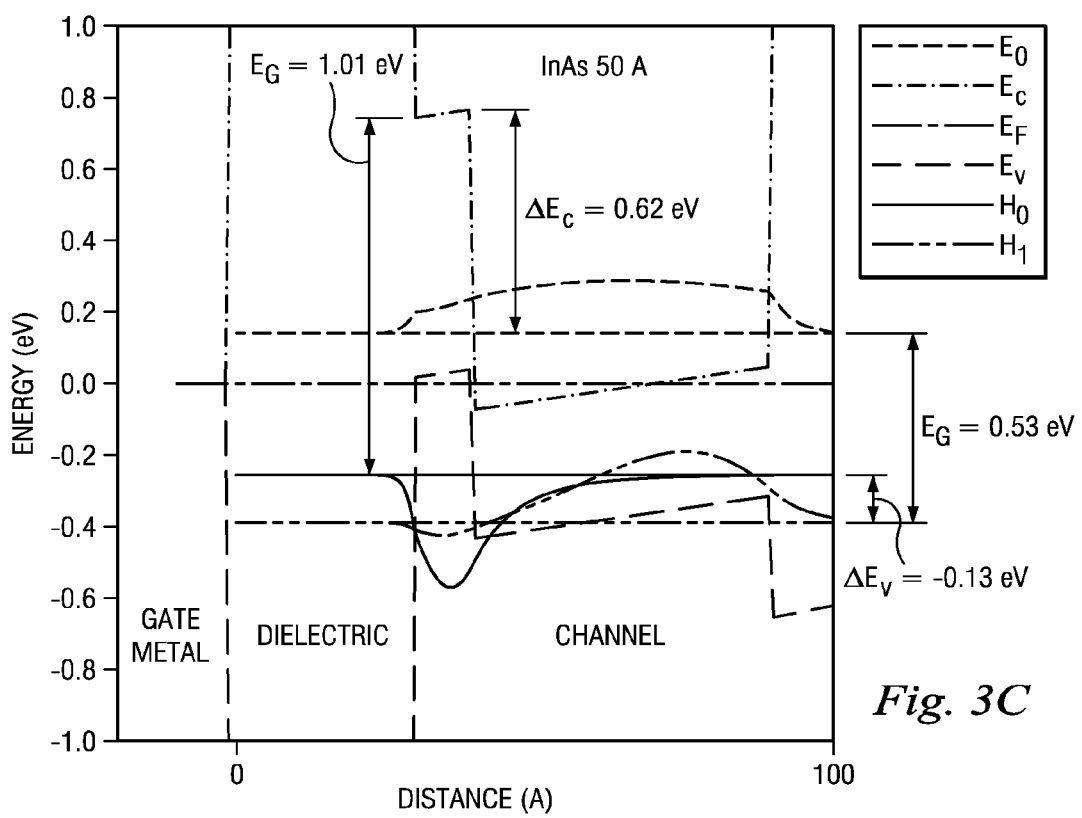
FIG. 3C is an energy band diagram of the layer structure of FIG. 3B.

FIG. 3C illustrates an energy band diagram of the layer structure 300 as depicted in FIG. 3B with a 5 nm InAs layer 308 and the discrete electron energy level $E_0$ and hole energy levels $H_0$ and $H_1$. The bandgap $E_G$ of the InAs quantum well layer is 0.53 eV and is increased due to quantum size effects by 0.17 eV from the InAs bulk value of 0.36 eV. The unified effective electron mass $m_n$=0.033.

Figure 4A:
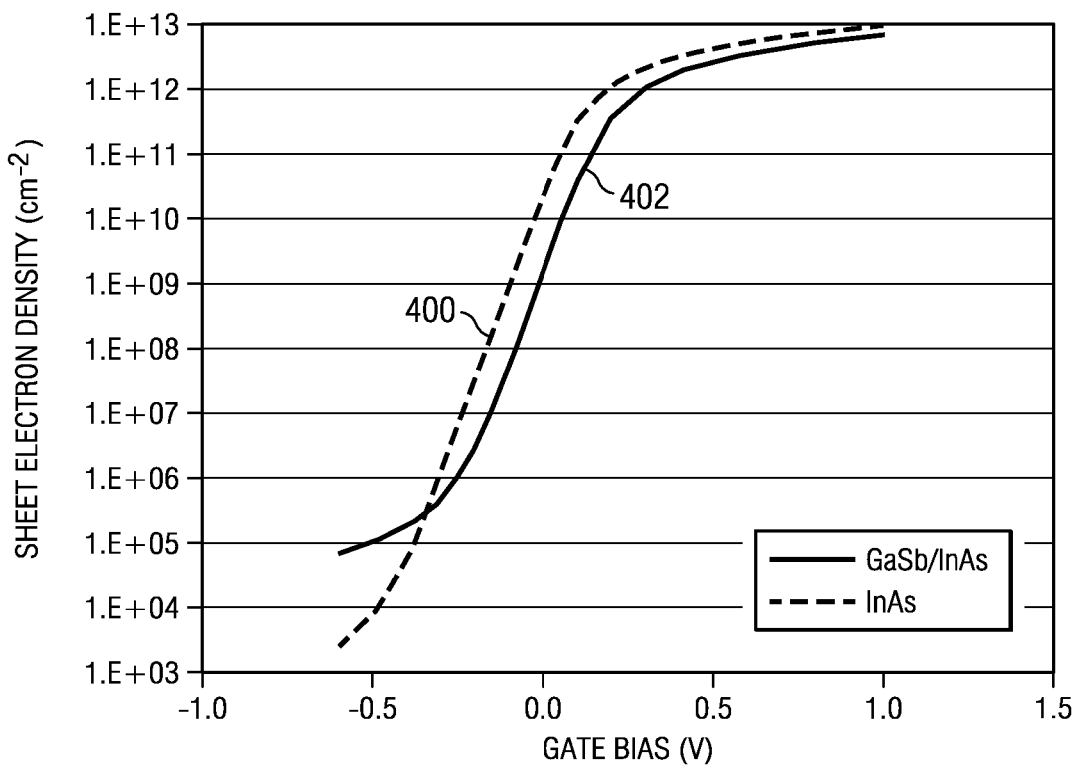
FIGS. 4A and 4B are graphs showing sheet electron density as a function of gate bias for the layer structures of FIGS. 1B and 3B on logarithmic and linear scales.
Figure 4B:
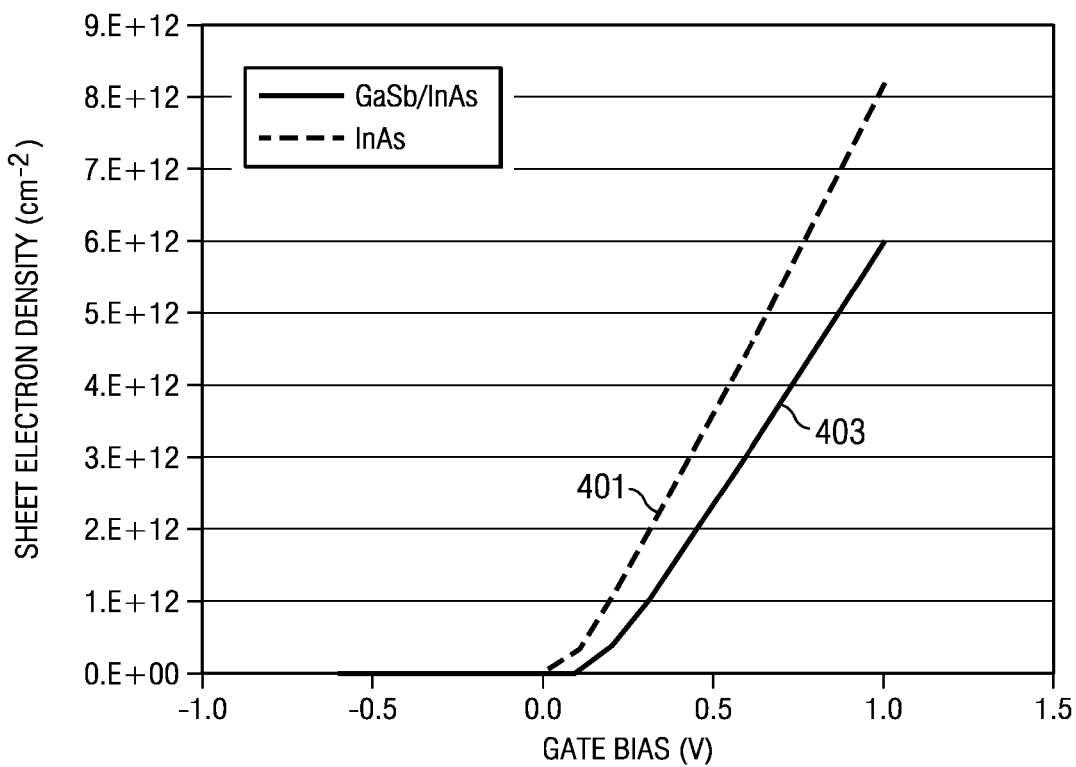

FIGS. 4A and 4B illustrate graphs of sheet electron density as a function of gate bias for the layer structure 100 as shown in FIG. 1B for 5 nm InAs layer thickness, represented by lines 400, 401 ($m_n$=0.038), and for the layer structure 300 as shown in FIG. 3B for 1 nm GaSb/5 nm InAs layer thickness, as represented by lines 402, 403 ($m_n$=0.033) on a logarithmic scale (FIG. 4A) and a linear scale (FIG. 4B). The higher sheet electron density for the embodiment depicted in FIG. 1B is due to higher unified effective mass $m_n$ and lower equivalent oxide thickness (EOT).

Figure 5:
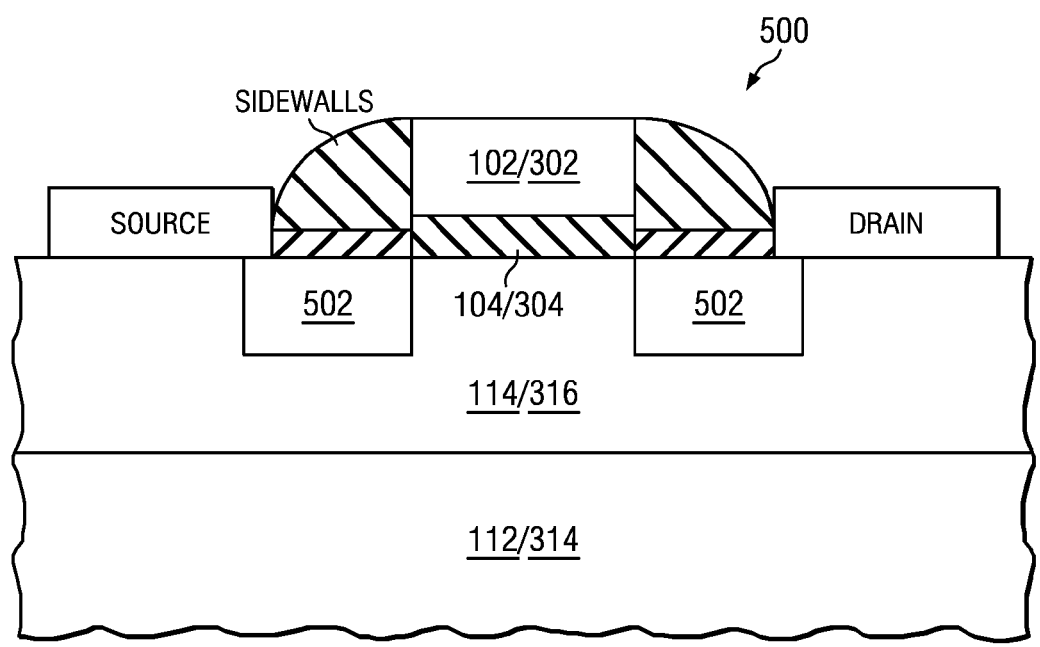
FIG. 5 illustrates a MOSFET incorporating the layer structure illustrated in FIG. 1B or 3B.

FIG. 5 illustrates a MOSFET 500 incorporating the layer structures implemented using the layer structure 100 depicted in FIG. 1B. It will be recognized that the MOSFET 500 may also be implemented using the layer structure 300 depicted in FIG. 3B. N-type extensions 502 can be implemented using standard means such as ion implantation.

Figure 6A:
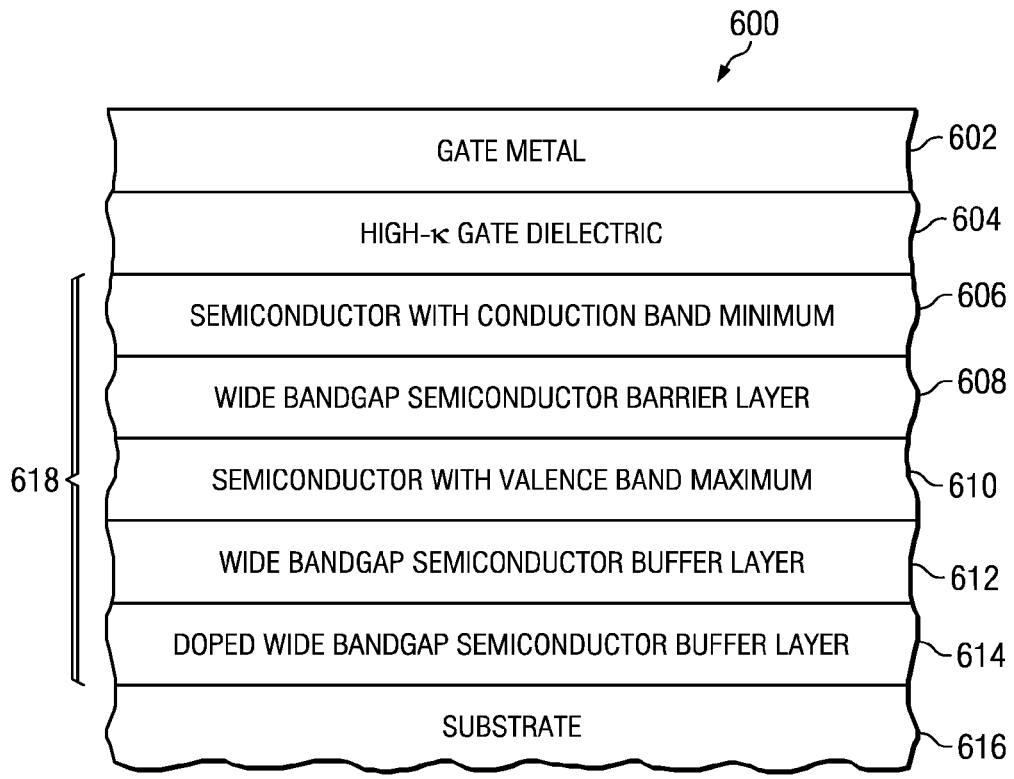
FIG. 6A illustrates a layer structure used in an n-channel transistor in accordance with one embodiment.

FIG. 6A illustrates a layer structure 600 used in an n-channel transistor according to another embodiment and comprises a gate metal layer 602, a high-κ gate dielectric layer 604, a semiconductor channel layer 1 with a conduction band minimum 606, a wide bandgap semiconductor barrier layer 608, a semiconductor layer 2 with a valence band maximum 610, a wide bandgap semiconductor buffer layer 612, a doped wide bandgap semiconductor buffer layer 614, and a substrate 616. The gate metal layer 602 is selected with a metal of appropriate workfunction. The semiconductor layer 2 with the valence band maximum 610 is selected such that the valence band maximum $E_{v2}$ is located in the vicinity of the conduction band minimum $E_{c1}$ of the semiconductor channel layer 1 with the conduction band minimum 606. Layers 606-614 are collectively designated by a reference numeral 618.

Figure 6B:
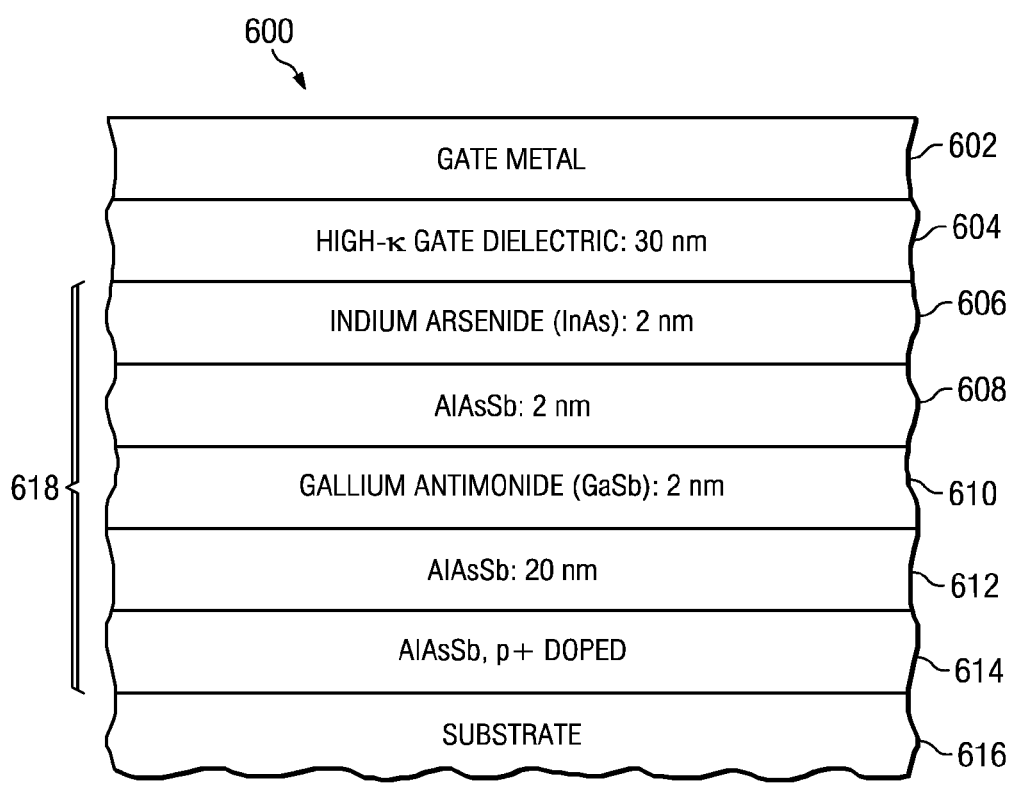
FIG. 6B is a more detailed illustration of one embodiment of the layer structure of FIG. 6A.

FIG. 6B is a more detailed illustration of an embodiment of the layer structure 600 of FIG. 6A for implementing an n-channel transistor. The wide bandgap barrier and buffer layers 608, 612, comprise AlAsSb having a thickness of approximately 2 nm and 20 nm, respectively, the semiconductor layer 2 with a valence band maximum $E_{V2}$ 610 comprises GaSb having a thickness of approximately 2 nm, and the semiconductor channel layer 1 with a conduction band minimum $E_{C1}$ 606 comprises InAs having a thickness of approximately 2 nm. For the selected materials, $E_{V2}$=−4.79 eV and $E_{C1}$=−4.9 eV. The doped wide bandgap semiconductor buffer layer comprises a $p^+$ doped AlAsSb layer 614. In one embodiment, the high-κ gate dielectric layer 604 may comprise hafnium oxide ($HfO_2$) having a thickness of approximately 30 nm. In the same or another embodiment, the gate metal layer 602 may comprise tantalum nitride (TaN).

Figure 7A:
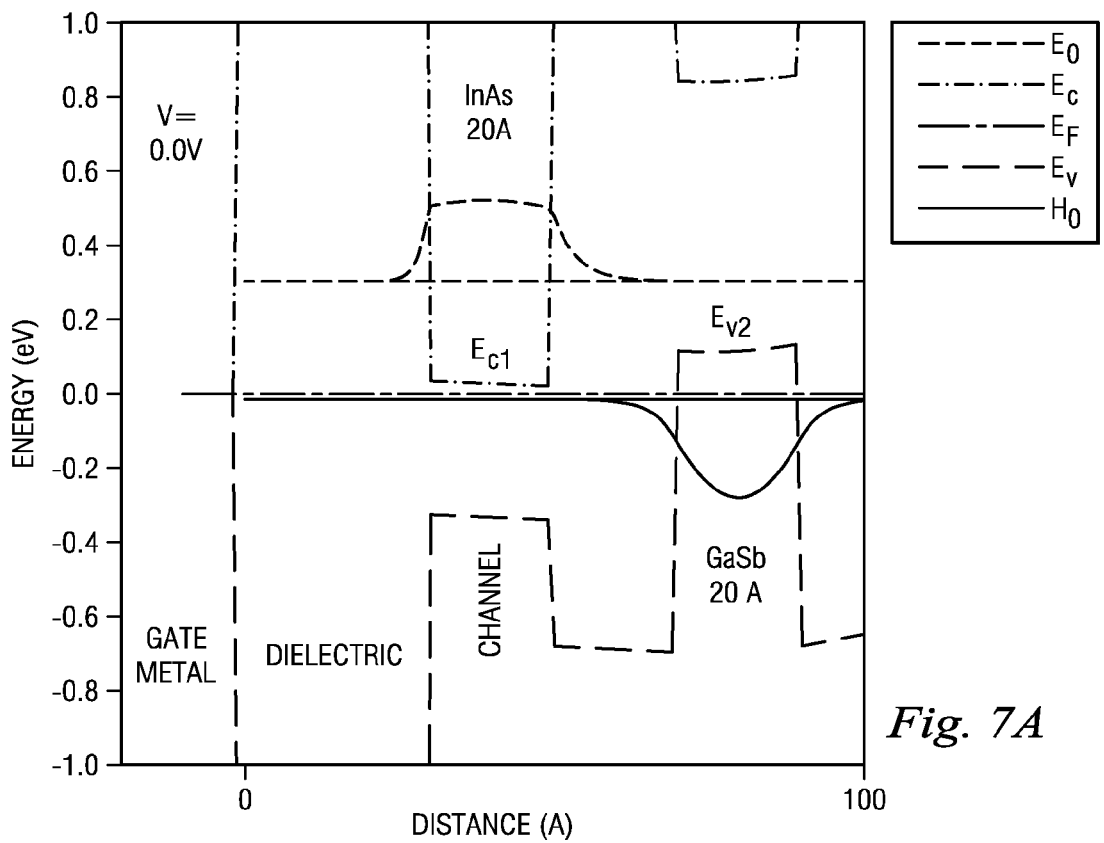
FIG. 7A is a calculated band diagram illustrating relative energy levels of the layer structure of FIG. 6B in thermal equilibrium.

FIG. 7A illustrates a calculated band diagram displaying the relative energy levels of the n-channel device layer structure 600 as depicted in FIG. 6B in thermal equilibrium (bias=0 V) including the discrete electron energy level $E_0$ (electron ground level) and hole energy level $H_0$ (heavy or light hole level). The Fermi level $E_F$ (dashed line) is positioned at an energy of 0 eV. In equilibrium and at zero bias, the discrete hole energy level $H_0$ (shown with its wavefunction $\psi_{Ho}$) is positioned below the InAs conduction band minimum $E_{c1}$. Since the discrete InAs electron energy level $E_0$ is located substantially above $E_F$, the transistor is off and the electron sheet carrier concentration $n_s$ is low. In the case shown in FIG. 7A, $n_s=5.7\times10^6$ cm$^{-2}$. The effective unified electron mass $m_n$ of the discrete level $E_0$ is 0.067 and the effective unified hole mass $m_p$ for $H_0$ is estimated to 0.4. The effective gate metal workfunction is 4.95 eV.

Figure 7B:
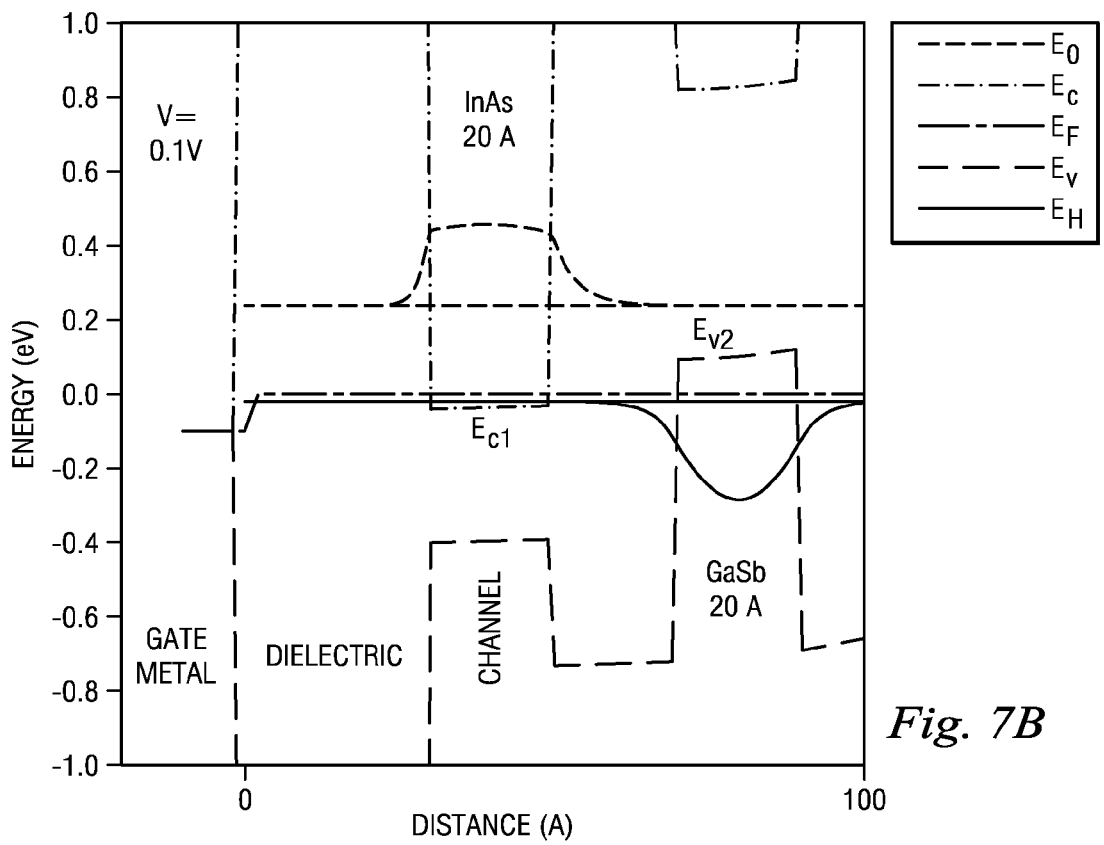
FIG. 7B is a calculated band diagram illustrating relative energy levels of the layer structure of FIG. 6B under a bias of −0.1 V applied to the gate electrode thereof.

FIG. 7B illustrates a calculated energy band diagram of the n-channel device layer structure 600 as depicted in FIG. 6B under a bias of +0.1 V applied to the gate electrode. The hybrid state $E_H$ (its wavefunction $\psi_H$ is here only shown in the GaSb layer since the simulator cannot calculate hybrid states) is formed. Using the energy positions of $E_F$ and $E_H$ shown in FIG. 7B, an electron density $\delta_{on}=1.2\times10^{12}$ cm$^{-2}$ is calculated in the InAs layer with an estimated unified effective mass of the hybrid state of $m_H=0.2$. Immediately before the hybrid state forms, the layer structure is off with an electron density $\delta_{off}=6.3\times10^7$ cm$^{-2}$ resulting from $E_0$ in the InAs layer and yielding a "hybrid switching ratio" HSR=$\delta_{on}/\delta_{off}=1.9\times10^4$. Switching is assumed to occur almost instantaneously at the switch voltage $V_s$ when the hybrid state forms under appropriate gate bias. Switching may not be as abrupt as indicated because of lateral inhomogeneities in layer thickness, composition etc. $V_s$ is likely somewhat below +0.1 V and is set equal to +0.1 V in further illustrations for purposes of simplicity. The differential gate efficiency (modulation of the InAs conduction band minimum $E_c$ relative to $H_0$ before $E_H$ forms) with respect to gate voltage is 55%.

A correct and self-consistent calculation of the hybridized state will lead to some adjustment of its energy position, wavefunction, unified effective mass, as well as carrier density, and will further give rise to an additional electric field between the GaSb and InAs layers due to the dipole charge on $E_H$. All such adjustments may produce somewhat lower $\delta_{on}$ and HSR and shift $V_s$ by some amount compared to the values indicated here. In fact, the maximum $\delta_{on}$ under optimum conditions (the only charge in the system is related to the dipole on $E_H$) can be estimated using $\delta_{on}=0.5$ kT $m_H/(\pi\hbar)*\ln(2)=7.5\times10^{11}$ cm$^{-2}$ with $m_H=0.2$. Here, k, T, and $\hbar$ are the Boltzmann constant, the absolute temperature, and the reduced Planck constant, respectively. Realistic values for $\delta_{on}$ may be around 3-4$\times10^{11}$ cm$^{-2}$ lowering achievable HSR values at room temperature to about 5000 for 2 nm InAs layer thickness. Higher SNR may be achievable for thinner InAs layers. In general, upper limit HSR can be estimated using $0.5*\ln(2)*(m_H/m_n)*\exp(E_0-E_c)/kT$ which approximately equals $\exp(E_0-E_c)/kT$ with $m_H=0.2$ and $m_n=0.067$. For InAs thickness of 1.5, 2, and 5 nm, $E_0-E_c=0.38, 0.29$, and 0.11 eV resulting in theoretical HSR of $2.4\times10^6$, $7.3\times10^4$, and 70 at room temperature, respectively.

Figure 8A:
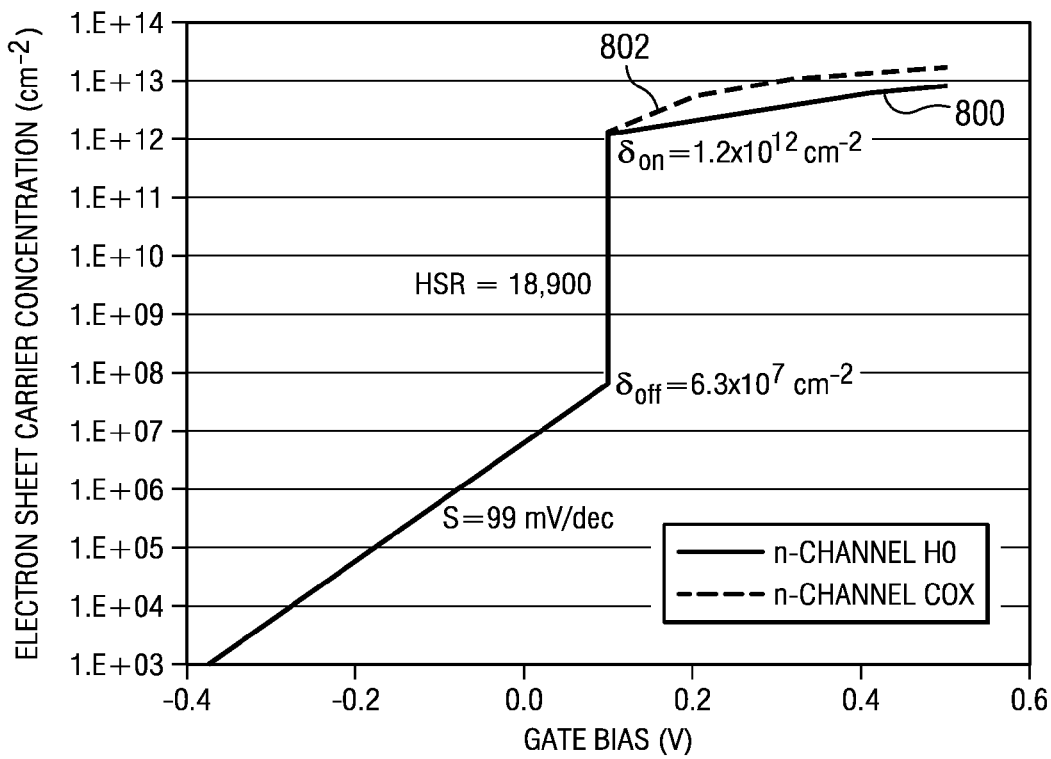
FIGS. 8A and 8B are graphs showing calculated electron sheet carrier concentration as a function of gate bias for the layer structure of FIG. 6B on logarithmic and linear scales.
Figure 8B:
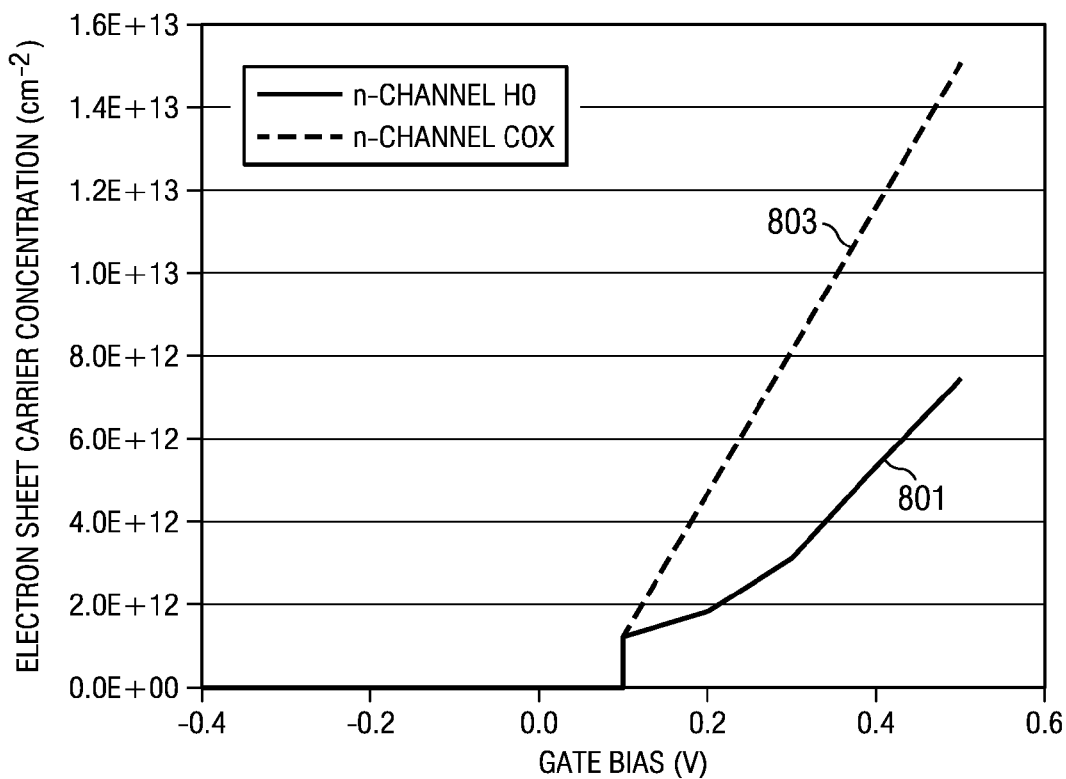

FIGS. 8A and 8B illustrates graphs of calculated electron sheet carrier concentration $n_s$ as a function of gate bias for the n-channel structure 600 as depicted in FIG. 6B on a logarithmic scale (FIG. 8A) and a linear scale (FIG. 8B). It will be recognized that $n_s$ at and above $V_s$ are estimated using the position of the state $H_0$, represented by lines 800, 801, or the oxide capacitance $C_{ox}$, represented by lines 802, 803. The subthreshold swing S in the off-state (99 mV/dec) is limited due to the presence of a strong hole concentration in the GaSb layer. Although S is elevated, the presence of a hole layer only 4 nm below the channel will effectively suppress short channel effects. In general, the hybrid state essentially acts as a dramatic electron density booster carrying the device almost immediately to high $\delta_{on}$. This is a desirable property for a "millivolt switch". The embodiments illustrated in FIGS. 6A-8B may be used in implementing high performance ("HP"), low operating power ("LOP"), and low standby power ("LSTP") devices.

Figure 9A:
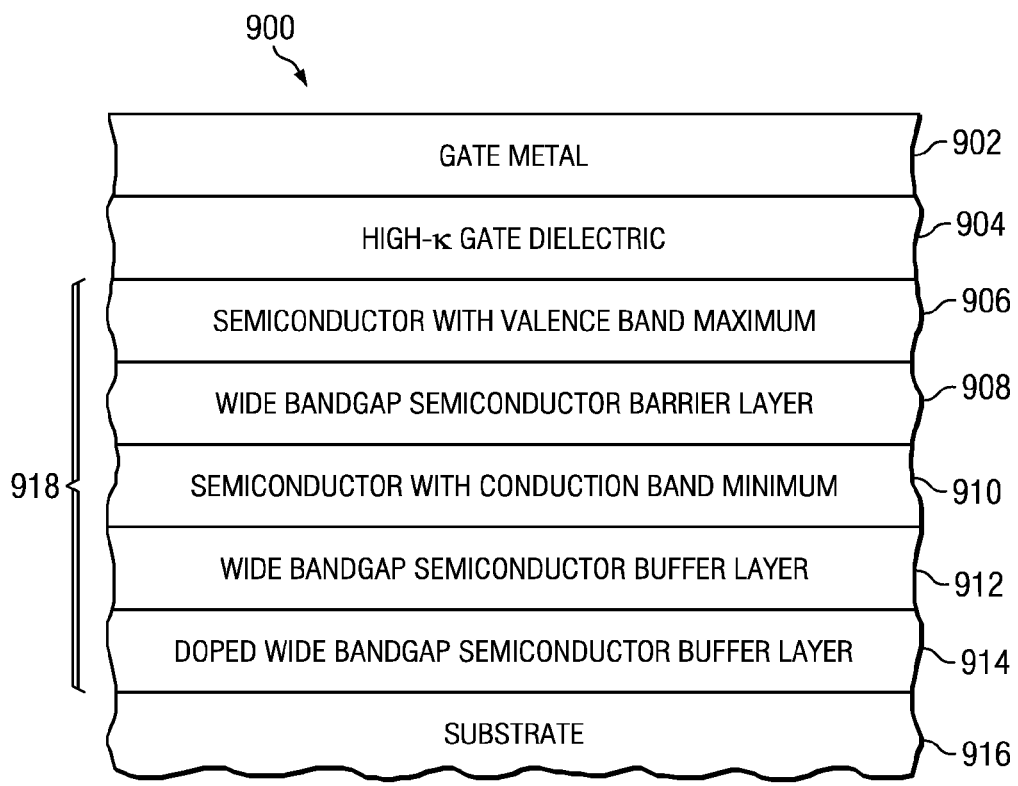
FIG. 9A illustrates a layer structure used in an p-channel transistor in accordance with one embodiment.

FIG. 9A illustrates a layer structure 900 used in a p-channel transistor according to another embodiment of the invention and comprises a gate metal layer 902, a high-κ gate dielectric layer 904, a semiconductor channel layer 1 with a valence band maximum 906, a wide bandgap semiconductor barrier layer 908, a semiconductor layer 2 with a conduction band minimum 910, a wide bandgap semiconductor buffer layer 912, a doped wide bandgap semiconductor buffer layer 914, and a substrate 916. The gate metal layer 902 comprises a metal of appropriate workfunction. The semiconductor layer 1 with the valence band maximum 906 comprises a material selected such that the valence band maximum $E_{v1}$ is located in the vicinity of the conduction band minimum $E_{c2}$ of the semiconductor layer 2 with the conduction band minimum 910. Layers 906-916 are collectively designated by a reference numeral 918.

Figure 9B:
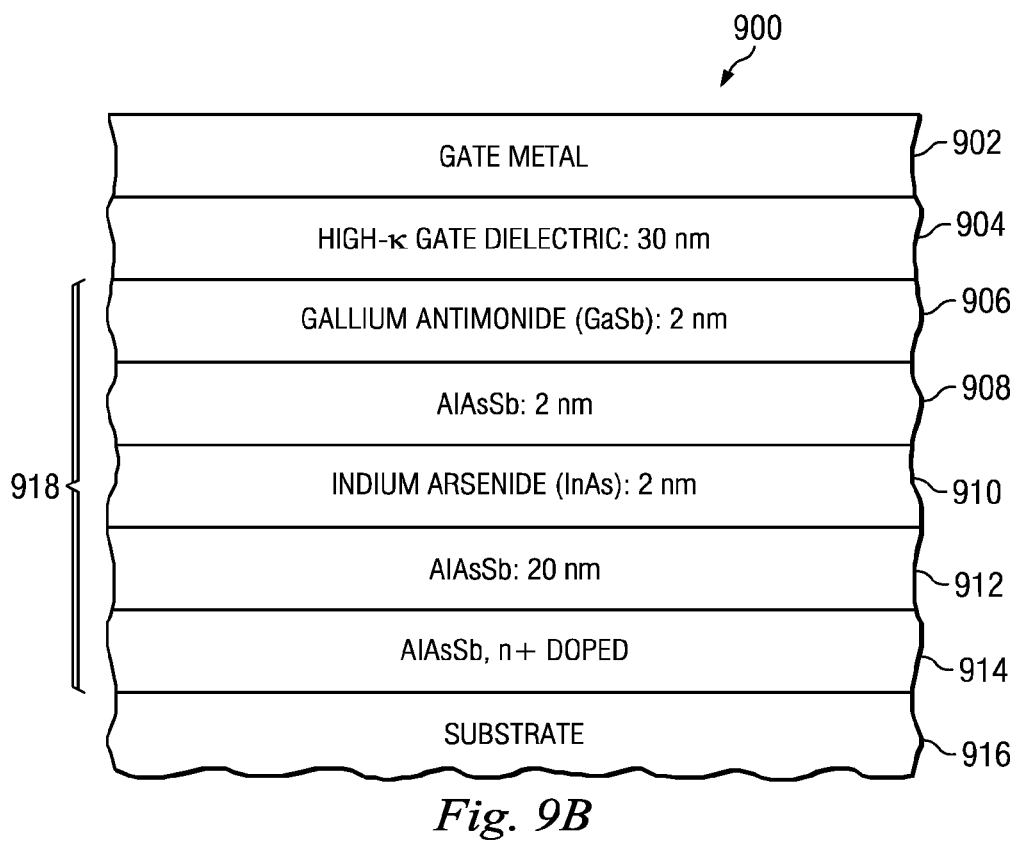
FIG. 9B is a more detailed illustration of one embodiment of the layer structure of FIG. 9A.

FIG. 9B is a more detailed illustration of an embodiment of the layer structure 900 of FIG. 9A for implementing a p-channel transistor. The wide bandgap barrier and buffer layers 908, 912, 914, comprise AlAsSb, channel layer 1 with a valence band maximum $E_{V1}$ 906 comprises GaSb, layer 2 with a conduction band minimum $E_{C2}$ 910 comprises InAs. For the selected materials, $E_{V1}=-4.79$ eV and $E_{C2}=-4.9$ eV. The doped wide bandgap semiconductor buffer layer comprises a n$^+$ doped AlAsSb layer. In one embodiment, the high-κ gate dielectric layer 904 may comprise hafnium oxide (HfO$_2$) having a thickness of approximately 30 nm. In the same or another embodiment, the gate metal layer 902 may comprise tantalum nitride (TaN).

Figure 10A:
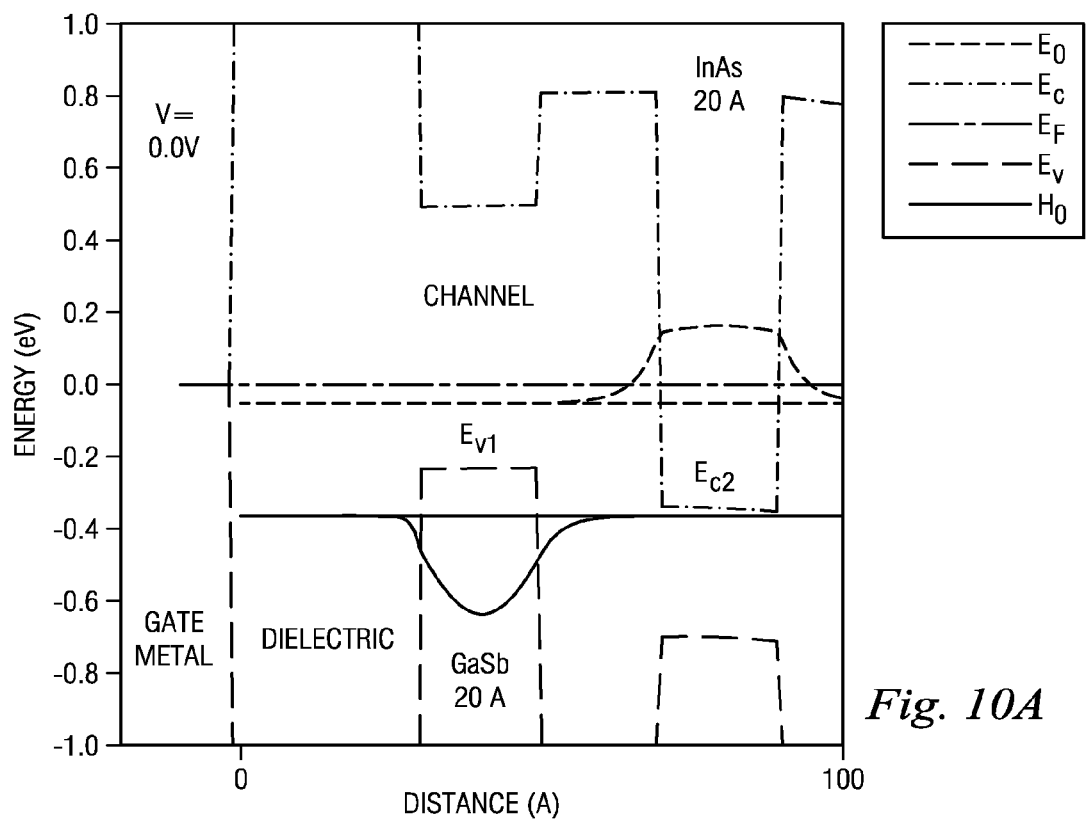
FIG. 10A is a calculated band diagram illustrating relative energy levels of the layer structure of FIG. 9B in thermal equilibrium.

FIG. 10A is a calculated band diagram illustrating the relative energy levels of the p-channel device layer structure depicted in FIG. 9B in thermal equilibrium (bias=0V) including the discrete electron energy level $E_0$ (electron ground level) and hole energy level $H_0$ (heavy or light hole level). The Fermi level $E_F$ is positioned at an energy of 0 eV. In equilibrium and at zero bias, the discrete hole energy level $H_0$ (shown with its wavefunction $\psi_{Ho}$) is positioned below the InAs conduction band minimum $E_{c2}$. Since the discrete GaSb hole energy level $H_0$ is located substantially below $E_F$, the transistor is off and the hole sheet carrier concentration $p_s$ is low. In the case shown in FIG. 10A, $p_s=3.4\times10^6$ cm$^{-2}$. The effective gate metal workfunction is 4.55 eV.

Figure 10B:
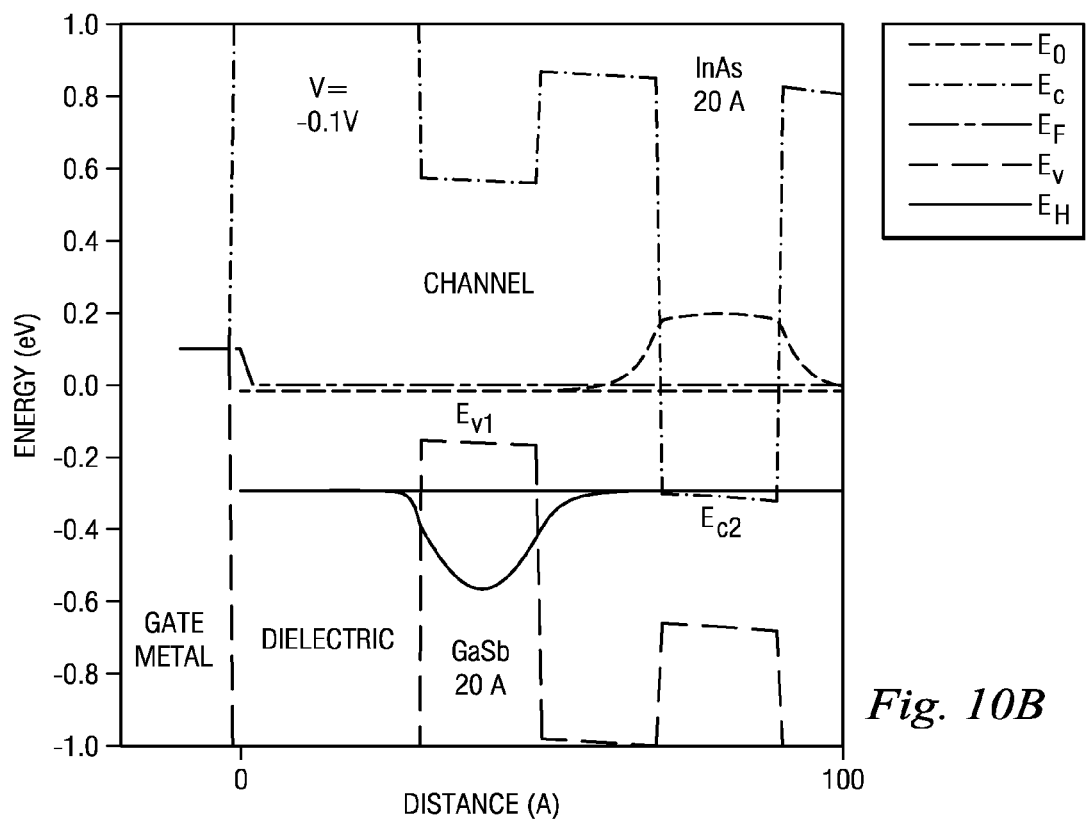
FIG. 10B is a calculated band diagram illustrating relative energy levels of the layer structure of FIG. 9B under a bias of −0.1 V applied to the gate electrode thereof.

FIG. 10B is a calculated energy band diagram of the p-channel device layer structure depicted in FIG. 9B under a bias of −0.1 V applied to the gate electrode. The hybrid state $E_H$ (its wavefunction $\psi_H$ is here only shown in the GaSb layer) is formed. In order to equalize electron and hole charge on the hybrid state, $E_H$ will be pulled up to a position which equals that of $E_F$ when $E_H$ forms (not shown). Assuming an ideal case with the only charge in the system being related to the dipole on $E_H$, $\delta_{on}$ can be estimated to $7.5\times10^{11}$ cm$^{-2}$. Under more realistic circumstances, a $\delta_{on}$ of $4.1\times10^{11}$ cm$^{-2}$ is estimated. Immediately before the hybrid state forms, the layer structure is off with a hole density $\delta_{on}/\delta_{off}=5.3\times10^7$ cm$^{-2}$ resulting from $H_0$ in the GaSb layer and yielding a "hybrid switching ratio" HSR=$\delta_{on}/\delta_{off}=7.7\times10^3$. Switching is assumed to occur almost instantaneously at the switch voltage $V_s$ when the hybrid state forms under appropriate gate bias. Switching may not be as abrupt as indicated because of lateral inhomogeneities in layer thickness, composition etc. $V_s$ is likely somewhat above −0.1 V and is set equal to −0.1 V in further illustrations for purposes of simplicity. The differential gate efficiency (modulation of $H_0$ relative to the InAs conduction band minimum $E_c$ before $E_H$ forms) with respect to gate voltage is 39%.

A correct and self-consistent calculation of the hybridized state will lead to some adjustment of its energy position, wavefunction, unified effective mass, as well as carrier density, and will further give rise to an additional electric field between the GaSb and InAs layers due to the dipole charge on $E_H$. Due to the nature of switching in the proposed p-channel device (pulling up of the hybrid level by up to 300 meV during switching), some hysteresis with respect to gate voltage will occur.

Figure 11A:
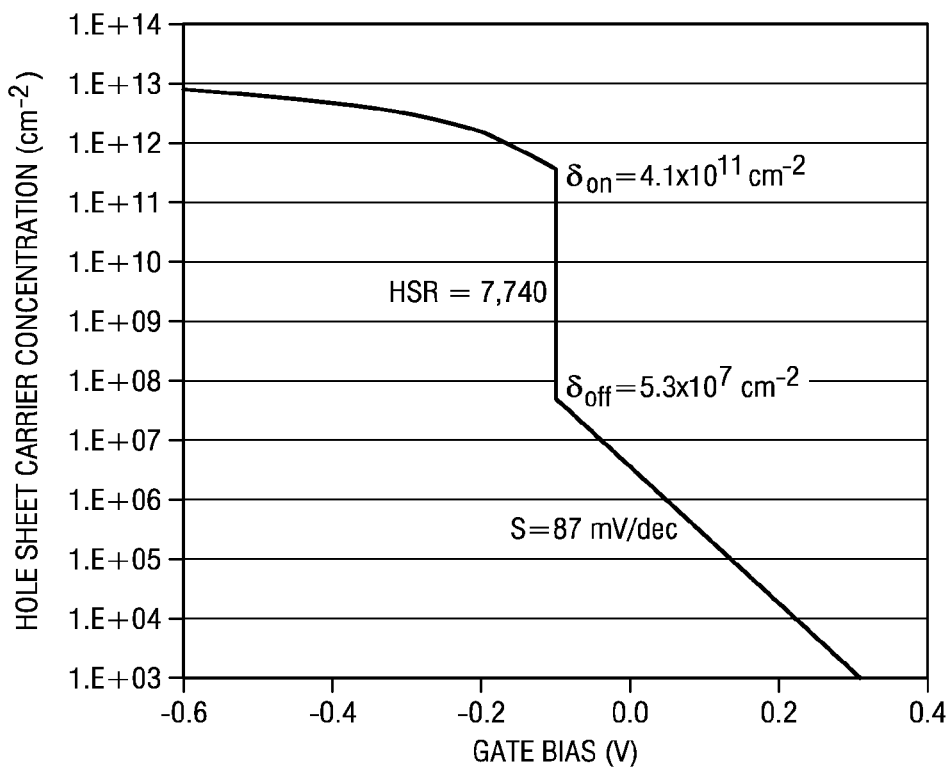
FIGS. 11A and 11B are graphs showing calculated hole sheet carrier concentration as a function of gate bias for the layer structure of FIG. 9B on logarithmic and linear scales.
Figure 11B:
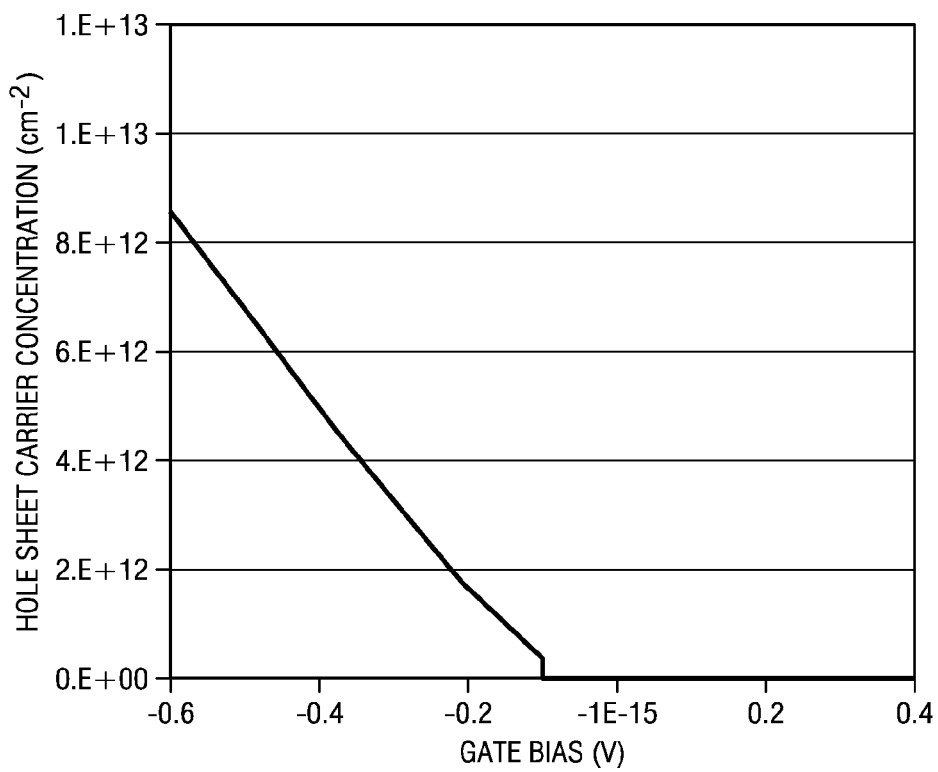

FIGS. 11A and 11B are graphs illustrating calculated hole sheet carrier concentration $p_s$ as a function of gate bias for the p-channel structure depicted in FIG. 9B on a logarithmic scale (FIG. 11A) and a linear scale (FIG. 11B). It will be recognized that $p_s$ at and below $V_s$ are estimates. The sub-threshold swing S in the off-state (87 mV/dec) is limited due to the presence of a strong electron concentration in the InAs layer. Although S is elevated, the presence of an electron layer only 4 nm below the channel will effectively suppress short channel effects. In general, the hybrid state essentially acts as a dramatic hole density booster carrying the device almost immediately to high $\delta_{on}$. This is a desirable property for a "millivolt switch".

Figure 12A:
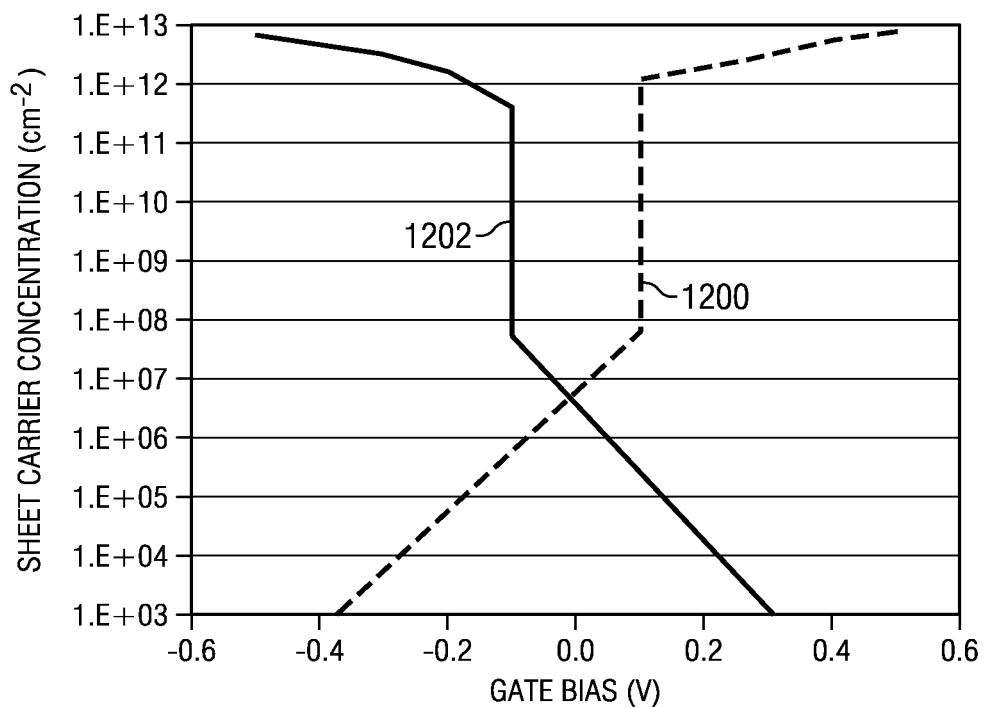
FIGS. 12A and 12B are graphs summarizing the data shown in FIGS. 8A-8B and 11A-11B for complementary n- and p-channel devices.
Figure 12B:
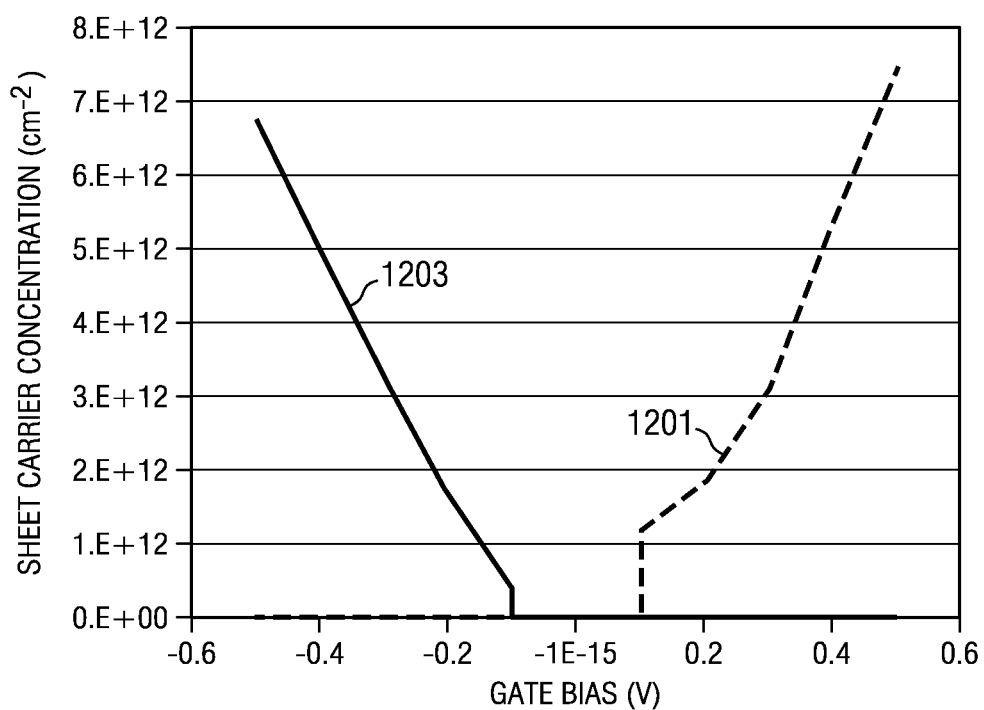

FIGS. 12A and 12B illustrate graphs summarizing the data shown in FIGS. 8 and 11 for complementary n-channel devices (represented by lines 1200, 1201) and p-channel devices (represented by lines 1202, 1203), respectively. Since conduction in on-state is via a hybrid level $E_H$ with identical effective unified mass ($m_H$=0.2) for both n- and p-channel devices, p-channel on-state characteristics are expected to mirror n-channel behavior. The embodiments illustrated in FIGS. 9A-12B may be used in implementing high performance ("HP"), low operating power ("LOP"), and low standby power ("LSTP") devices.

Figure 13:
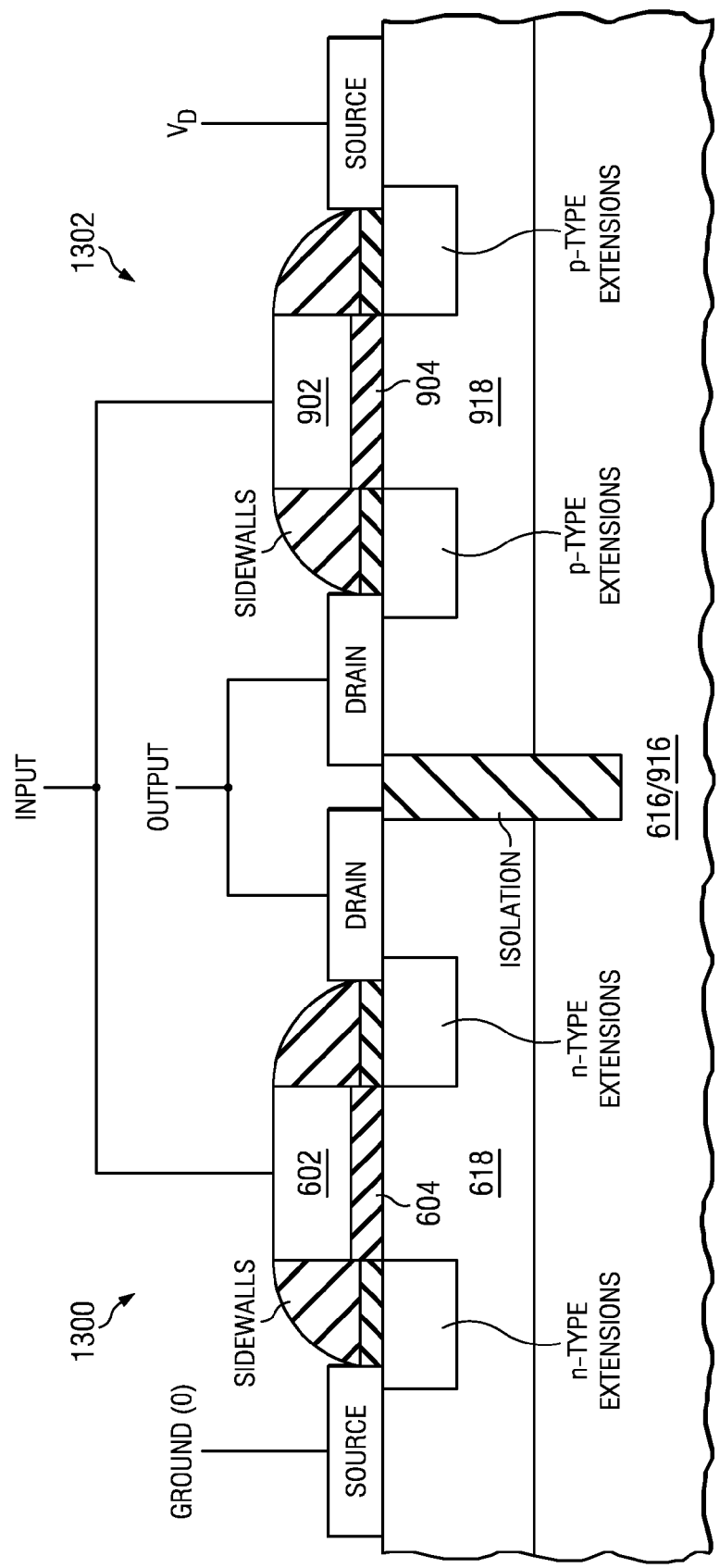
FIG. 13 illustrates a complementary inverter circuit comprising n- and p-channel devices in accordance with one embodiment connected in series.

FIG. 13 illustrates a complementary inverter circuit comprising an n-channel device (using the layer structure of FIG. 6B) 1300 and a p-channel device (using the layer structure of FIG. 9B) 1302 connected in series. In one example, the effective gate workfunctions of the n- and p-channel device are 4.95 and 4.55 eV, respectively. The voltage at the gate metal electrode 602 and 902 is expressed relative to the corresponding source terminal of device 1300 and 1302, respectively. The embodiments illustrated in FIG. 13 may be used in implementing high performance ("HP"), low operating power ("LOP"), and low standby power ("LSTP") devices.

It will be recognized that all of the transistors described herein may be advantageously implemented in any electronic device and/or circuit that employs one or more transistors.

While the preceding shows and describes one or more embodiments, it will be understood by those skilled in the art that various changes in form and detail may be made therein without departing from the spirit and scope of the present disclosure. For example, various steps of the described methods may be executed in a different order or executed sequentially, combined, further divided, replaced with alternate steps, or removed entirely. In addition, various functions illustrated in the methods or described elsewhere in the disclosure may be combined to provide additional and/or alternate functions. Therefore, the claims should be interpreted in a broad manner, consistent with the present disclosure.

What is claimed is:

1. An essentially planar inverter circuit comprising:
    an n-channel transistor employing a first layer structure comprising:
        a first semiconductor layer having a conduction band minimum $E_{C1}$;
        a second semiconductor layer having a first discrete hole level $H_0$;
        a first wide band gap semiconductor barrier layer disposed between the first and the second semiconductor layers;
        a first gate dielectric layer disposed above the first semiconductor layer; and
        a first gate metal layer disposed above the first gate dielectric layer;
        wherein the first discrete hole level $H_0$ is positioned below the conduction band minimum $E_{c1}$ for zero bias applied to the first gate metal layer; and
    a p-channel transistor employing a second layer structure comprising:
        a third semiconductor layer having a second discrete hole level $H_0$;
        a fourth semiconductor layer having a conduction band minimum $E_{C2}$;
        a second wide band gap semiconductor barrier layer disposed between the third and the fourth semiconductor layers;
        a second gate dielectric layer disposed above the third semiconductor layer; and
        a second gate metal layer disposed above the second gate dielectric layer;
        wherein the second discrete hole level $H_0$ is positioned below the conduction band minimum $E_{c2}$ for zero bias applied to the second gate metal layer.

2. The inverter circuit of claim 1 wherein an electron density of the first semiconductor layer increases abruptly in response to application of a positive bias to the first gate metal layer.

3. The inverter circuit of claim 1 wherein a hole density of the third semiconductor layer increases abruptly in response to application of a negative bias to the second gate metal layer.

4. The inverter circuit of claim 1 wherein the first layer structure further comprises:
    a first wide band gap semiconductor buffer layer disposed beneath the second semiconductor layer; and
    a p-doped wide band gap semiconductor buffer layer disposed beneath the first wide band gap semiconductor buffer layer;
    and wherein the second layer structure further comprises:
    a second wide band gap semiconductor buffer layer disposed beneath the fourth semiconductor layer;
    an n-doped wide band gap semiconductor buffer layer disposed beneath the second wide band gap semiconductor buffer layer.

5. The inverter circuit of claim 4 wherein the first wide band gap semiconductor buffer layer comprises AlAsSb.

6. The inverter circuit of claim 4 wherein the first wide band gap semiconductor buffer layer has a thickness of approximately 20 nm.

7. The inverter circuit of claim 4 wherein the p-doped wide band gap semiconductor buffer layer comprises p-doped AlAsSb.

8. The inverter circuit of claim 4 wherein the second wide band gap semiconductor buffer layer comprises AlAsSb.

9. The inverter circuit of claim 4 wherein the second wide band gap semiconductor buffer layer has a thickness of approximately 20 nm.

10. The inverter circuit of claim 4 wherein the n-doped wide band gap semiconductor buffer layer comprises n-doped AlAsSb.

11. The inverter circuit of claim 1 wherein $E_{C1}$=−4.9 eV.

12. The inverter circuit of claim 1 wherein the first wide band gap semiconductor barrier layer comprises AlAsSb.

13. The inverter circuit of claim 1 wherein the first wide band gap semiconductor barrier layer has a thicknesses of approximately 2 nm.

14. The inverter circuit of claim 1 wherein the first semiconductor layer comprises InAs and has a thickness of approximately 2 nm.

15. The inverter circuit of claim 1 wherein the second semiconductor layer comprises GaSb and has a thickness of approximately 2 nm.

16. The inverter circuit of claim 1 wherein the first gate metal layer comprises TaN.

17. The inverter circuit of claim 1 wherein the first gate dielectric layer comprises $HfO_2$.

18. The inverter circuit of claim 1 wherein $E_{C2}=-4.9$ eV.

19. The inverter circuit of claim 1 wherein the second wide band gap semiconductor barrier layer comprises AlAsSb.

20. The inverter circuit of claim 1 wherein the second wide band gap semiconductor barrier layer has a thicknesses of approximately 2 nm.

21. The inverter circuit of claim 1 wherein the third semiconductor layer comprises GaSb and has a thickness of approximately 2 nm.

22. The inverter circuit of claim 1 wherein the fourth semiconductor layer comprises InAs and has a thickness of approximately 2 nm.

23. The inverter circuit of claim 1 wherein the second gate metal layer comprises TaN.

24. The inverter circuit of claim 1 wherein the second gate dielectric layer comprises $HfO_2$.

25. The inverter circuit of claim 1 further comprising a substrate disposed beneath all of the layers.

26. An essentially planar inverter circuit comprising:
an n-channel transistor employing a first layer structure comprising:
means for providing a layer having a conduction band minimum $E_{C1}$;
means for providing a first layer having a discrete hole level $H_0$;
means for providing a first wide band gap barrier between the layer having a conduction band minimum $E_{C1}$ and the first layer having a discrete hole level;
means for providing a first high-κ dielectric layer above the layer having a conduction band minimum $E_{C1}$; and
means for providing a first gate metal layer disposed above the first high-κ dielectric layer;
wherein the discrete hole level $H_0$ is positioned below the conduction band minimum $E_{c1}$ for zero bias applied to the first gate metal layer;
a p-channel transistor employing a second layer structure comprising:
means for providing a second layer having a discrete hole level $H_0$;
means for providing a layer having conduction band minimum $E_{C2}$;
means for providing a second wide band gap barrier between the layer having a conduction band minimum $E_{C2}$ and the second layer having a discrete hole level;
means for providing a second high-κ dielectric layer above the second layer having a discrete hole level; and
means for providing a second gate metal layer disposed above the second high-κ dielectric layer;
wherein the discrete hole level $H_0$ is positioned below the conduction band minimum $E_{c2}$ for zero bias applied to the second gate metal layer.

27. The inverter circuit of claim 26 wherein an electron density of the layer having a conduction band minimum $E_{C1}$ increases abruptly in response to application of a positive bias to the first gate metal layer.

28. The inverter circuit of claim 26 wherein a hole density of the second layer having a discrete hole level increases abruptly in response to application of a negative bias to the second gate metal layer.

29. The inverter circuit of claim 26 wherein the first layer structure further comprises:
means for providing a first wide band gap buffer beneath the first layer having a discrete hole level; and
means for providing a p-doped wide band gap buffer disposed beneath the first wide band gap buffer;
and wherein the second layer structure further comprises:
means for providing a second wide band gap buffer beneath the layer having a conduction band minimum $E_{C2}$; and
means for providing an n-doped wide band gap buffer beneath the second wide band gap buffer.

30. The inverter circuit of claim 29 wherein the means for providing a first wide band gap buffer comprises AlAsSb.

31. The inverter circuit of claim 29 wherein the means for providing a first wide band gap buffer has a thickness of approximately 20 nm.

32. The inverter circuit of claim 29 wherein the means for providing a p-doped wide band gap buffer comprises p-doped AlAsSb.

33. The inverter circuit of claim 29 wherein the means for providing a second wide band gap buffer comprises AlAsSb.

34. The inverter circuit of claim 29 wherein the means for providing a second wide band gap buffer has a thickness of approximately 20 nm.

35. The inverter circuit of claim 29 wherein the means for providing an n-doped wide band gap buffer comprises n-doped AlAsSb.

36. The inverter circuit of claim 26 wherein $E_{C1}=-4.9$ eV.

37. The inverter circuit of claim 26 wherein the means for providing a first wide band gap barrier comprises AlAsSb.

38. The inverter circuit of claim 26 wherein the means for providing a first wide band gap barrier has a thicknesses of approximately 2 nm.

39. The inverter circuit of claim 26 wherein the means for providing a layer having a conduction band minimum $E_{C1}$ comprises InAs having a thickness of approximately 2 nm.

40. The inverter circuit of claim 26 wherein the means for providing a second layer having a discrete hole level comprises GaSb having a thickness of approximately 2 nm.

41. The inverter circuit of claim 26 wherein the means for providing a first gate metal layer comprises TaN.

42. The inverter circuit of claim 26 wherein the means for providing a first high-κ dielectric layer comprises $HfO_2$.

43. The inverter circuit of claim 26 wherein $E_{C2}=-4.9$ eV.

44. The inverter circuit of claim 26 wherein the means for providing a second wide band gap barrier comprises AlAsSb.

45. The inverter circuit of claim 26 wherein the means for providing a second wide band gap barrier has a thicknesses of approximately 2 nm.

46. The inverter circuit of claim 26 wherein the means for providing a second layer having a discrete hole level comprises GaSb having a thickness of approximately 2 nm.

47. The inverter circuit of claim 26 wherein the means for providing a layer having a conduction band minimum $E_{C2}$ comprises InAs having a thickness of approximately 2 nm.

48. The inverter circuit of claim 26 wherein the means for providing a second gate metal layer comprises TaN.

49. The inverter circuit of claim 26 wherein the means for providing a high-κ dielectric layer comprises $HfO_2$.

50. A device including an essentially planar inverter circuit comprising:
   an n-channel transistor employing a first layer structure comprising:
      a first semiconductor layer having a conduction band minimum $E_{C1}$;
      a second semiconductor layer having a first discrete hole level $H_0$;
      a first wide band gap semiconductor barrier layer disposed between the first and the second semiconductor layers;
      a first gate dielectric layer disposed above the first semiconductor layer; and
      a first gate metal layer disposed above the first gate dielectric layer;
      wherein the first discrete hole level $H_0$ is positioned below the conduction band minimum $E_{c1}$ for zero bias applied to the first gate metal layer; and
   a p-channel transistor employing a second layer structure comprising:
      a third semiconductor layer having a second discrete hole level $H_0$;
      a fourth semiconductor layer having a conduction band minimum $E_{C2}$;
      a second wide band gap semiconductor barrier layer disposed between the third and the fourth semiconductor layers;
      a second gate dielectric layer disposed above the third semiconductor layer; and
      a second gate metal layer disposed above the second gate dielectric layer;
      wherein the second discrete hole level $H_0$ is positioned below the conduction band minimum $E_{c2}$ for zero bias applied to the second gate metal layer.

51. The device of claim 50 wherein the device is a low operating power ("LOP") device.

52. The device of claim 50 wherein the device is a high performance ("HP") device.

53. The device of claim 50 wherein the device is a low standby power ("LSTP") device.

* * * * *